United States Patent
Tseng et al.

(10) Patent No.: US 9,553,094 B2
(45) Date of Patent: Jan. 24, 2017

(54) SEMICONDUCTOR DEVICE AND METHOD FOR FABRICATING THE SAME

(71) Applicants: Wei-Hsiung Tseng, Seongnam-si (KR); Ju-Youn Kim, Suwon-si (KR); Seok-Jun Won, Seoul (KR); Jong-Ho Lee, Hwaseong-si (KR); Hye-Lan Lee, Hwaseong-si (KR); Yong-Ho Ha, Hwaseong-si (KR)

(72) Inventors: Wei-Hsiung Tseng, Seongnam-si (KR); Ju-Youn Kim, Suwon-si (KR); Seok-Jun Won, Seoul (KR); Jong-Ho Lee, Hwaseong-si (KR); Hye-Lan Lee, Hwaseong-si (KR); Yong-Ho Ha, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/069,920

(22) Filed: Mar. 14, 2016

(65) Prior Publication Data
US 2016/0315087 A1 Oct. 27, 2016

Related U.S. Application Data

(63) Continuation of application No. 14/592,842, filed on Jan. 8, 2015, now Pat. No. 9,287,181.

(30) Foreign Application Priority Data

Mar. 19, 2014 (KR) ........................ 10-2014-0032248

(51) Int. Cl.
*H01L 27/092* (2006.01)
*H01L 29/49* (2006.01)
*H01L 29/43* (2006.01)

(52) U.S. Cl.
CPC ......... *H01L 27/0924* (2013.01); *H01L 29/435* (2013.01); *H01L 29/4958* (2013.01)

(58) Field of Classification Search
CPC combination set(s) only.
See application file for complete search history.

(56) References Cited

U.S. PATENT DOCUMENTS 6,537,901 B2  3/2003  Cha et al.
7,122,414 B2  10/2006  Huotari
(Continued)

FOREIGN PATENT DOCUMENTS

KR  2002-0002175  1/2002
KR  10-2008-0060339  7/2008
KR  10-2008-0082132  9/2008

*Primary Examiner* — Mamadou Diallo
(74) *Attorney, Agent, or Firm* — Muir Patent Law, PLLC

(57) ABSTRACT

Provided is a method for fabricating a semiconductor device. The method includes forming an interlayer insulating layer on a substrate, the interlayer insulating layer including a first trench; forming a high-k dielectric layer in the first trench; successively forming a diffusion layer and a blocking layer on the high-k dielectric layer; subsequently performing annealing; after the annealing, successively removing the blocking layer and the diffusion layer; forming a first barrier layer on the high-k dielectric layer; successively forming a work function adjustment layer and a gate conductor on the first barrier layer; and forming a capping layer on the gate conductor.

12 Claims, 33 Drawing Sheets

(56) References Cited

U.S. PATENT DOCUMENTS

| | | |
|---|---|---|
| 7,547,951 B2 | 6/2009 | Lim et al. |
| 8,004,044 B2 | 8/2011 | Ogawa et al. |
| 8,513,740 B2 | 8/2013 | Park et al. |
| 2007/0178634 A1 | 8/2007 | Jung et al. |
| 2012/0003827 A1 | 1/2012 | Xu et al. |
| 2012/0119204 A1* | 5/2012 | Wong ............... H01L 21/823842 257/43 |
| 2013/0056833 A1 | 3/2013 | Takeoka |
| 2013/0168744 A1 | 7/2013 | Hsu et al. |
| 2013/0237046 A1 | 9/2013 | Lin et al. |
| 2013/0299914 A1* | 11/2013 | Kim ....................... H01L 27/092 257/369 |
| 2013/0299922 A1* | 11/2013 | Choi ................. H01L 21/82345 257/412 |
| 2014/0015062 A1* | 1/2014 | Yang ............... H01L 21/823857 257/369 |
| 2014/0103441 A1* | 4/2014 | Kim .................. H01L 21/82345 257/368 |
| 2015/0155365 A1* | 6/2015 | Lee ..................... H01L 29/4966 257/412 |
| 2015/0187892 A1* | 7/2015 | Yin ................... H01L 29/66492 438/296 |

* cited by examiner

SEMICONDUCTOR DEVICE AND METHOD FOR FABRICATING THE SAME

CROSS-REFERENCE TO RELATED APPLICATIONS

This application is a continuation of U.S. application Ser. No. 14/592,842, filed Jan. 8, 2015, which is based on and claims priority to Korean Patent Application No. 10-2014-0032248, filed on Mar. 19, 2014 in the Korean Intellectual Property Office, the disclosure of each of which is incorporated herein in its entirety by reference.

BACKGROUND

1. Field

The present inventive concept relates to a semiconductor device and a method for fabricating the same.

2. Description of the Prior Art

As the feature size of a MOS transistor is decreased, the lengths of a gate and a channel that is formed below the gate become short. Accordingly, various research has been performed to increase capacitance between the gate and the channel and to improve operation characteristics of the MOS transistor.

A MOS (Metal-Oxide-Semiconductor) transistor using a polysilicon gate electrode has been widely used. Since a polysilicon material can endure high temperature in comparison to most metals, polysilicon may be annealed at high temperatures together with source and drain regions. Further, since polysilicon can prevent ion implantation of atoms that are doped in a channel region, it becomes possible to form the polysilicon in a self-aligned source/drain structure after gate patterning is completed.

On the other hand, since the polysilicon material has high resistance in comparison to most metal material, a polysilicon gate electrode operates at lower speed than a gate that is made of a metal material. In order to compensate for the high resistance of the polysilicon material, a method for replacing the polysilicon gate electrode by a metal gate electrode may be used. This method may be performed using an RMG (Replacement Metal Gate) process, in which a high-temperature process is performed while the polysilicon exists on a semiconductor substrate, and after the process, a replacement metal gate is formed through removal and replacement of the polysilicon by a metal.

SUMMARY

Embodiments of the present inventive concept provide a semiconductor device having improved operation characteristics.

Embodiments of the present inventive concept also provide a method for fabricating a semiconductor device having improved operation characteristics.

Additional advantages, subjects, and features of the inventive concept will be set forth in part in the description which follows and in part will become apparent to those having ordinary skill in the art upon examination of the following or may be learned from practice of the inventive concept.

In one aspect of the present inventive concept, a method of fabricating a semiconductor device is disclosed. The method includes forming an interlayer insulating layer on a substrate, the interlayer insulating layer including a first trench; forming a high-k dielectric layer in the first trench; successively forming a diffusion layer and a blocking layer on the high-k dielectric layer; subsequently performing annealing; after the annealing, successively removing the blocking layer and the diffusion layer; forming a first barrier layer on the high-k dielectric layer; successively forming a work function adjustment layer and a gate conductor on the first barrier layer; and forming a capping layer on the gate conductor.

In another aspect of the present inventive concept, a method of fabricating a semiconductor includes forming an interlayer insulating layer on a substrate on which a first region and a second region are defined, the interlayer insulating layer including a first trench arranged in the first region and a second trench arranged in the second region; forming a high-k dielectric layer in the first and second trenches; successively forming a diffusion layer and a blocking layer on the high-k dielectric layer in the first and second trenches; subsequently performing annealing; after performing the annealing, removing the blocking layer in the first and second trenches; forming a first barrier layer on the high-k dielectric layer in the first and second trenches; forming a first work function adjustment layer in the second trench; successively forming a second work function adjustment layer and a second barrier layer in the first and second trenches; and forming a capping layer that covers the first and second trenches.

In a further aspect of the present inventive concept, a method of fabricating a semiconductor device includes providing a substrate including a first region and a second region; forming a first fin and a second fin that project from the first and second regions, respectively; forming first and second dummy gate structures that cross the first and second fins, respectively; forming first and second trenches that expose the first and second fins, respectively, through removal of the first and second dummy gate structures; forming a high-k dielectric layer that crosses the fins in the first and second trenches; successively stacking a diffusion layer and a blocking layer on the high-k dielectric layer and then performing annealing; removing the blocking layer; forming a first barrier layer in the first and second trenches; forming a work function adjustment layer on the first barrier layer in the first and second trenches; and forming first and second capping layers that cover the first and second trenches, respectively.

Another aspect of the inventive concept includes a method for fabricating a semiconductor device comprising: providing a substrate on which a first region and a second region are defined; forming first and second fins that project from the first and second regions, respectively; forming a first gate structure that crosses the first fin and a second gate structure that crosses the second fin; and forming first and second capping layers that cover the first and second gate structures, respectively. The forming the first and second gate structures may include: forming first and second interface layers on the first and second fins, respectively; forming first and second high-k dielectric layers on the first and second interface layers, respectively; successively forming a diffusion layer and a blocking layer on the first and second high-k dielectric layers; subsequently performing annealing; subsequently successively removing the block layer and the diffusion layer; forming first and second barrier layers on the first and second high-k dielectric layers, respectively; forming first and second work function adjustment layers on the first and second barrier layer, respectively; forming third and fourth barrier layers on the first and second work function adjustment layers, respectively, the fourth barrier layer filling in the second trench; and forming a gate metal that fills in the first trench on the third barrier layer.

In other aspects, a semiconductor device may include: A semiconductor device comprising: a substrate on which a first region and a second region are defined; first and second gate structures arranged on the first and second regions, respectively; and a capping layer covering the first and second gate structures. The first gate structure may include a first interface layer arranged on the substrate, a first high-k dielectric layer arranged on the first interface layer, a first diffusion layer arranged on the first high-k dielectric layer, a first barrier layer arranged on the first diffusion layer, a first work function adjustment layer arranged on the first barrier layer, a third barrier layer arranged on the first work function adjustment layer, and a gate metal arranged on the first work function adjustment layer, and the second gate structure may include a second interface layer arranged on the substrate, a second high-k dielectric layer arranged on the second interface layer, a second diffusion layer arranged on the second high-k dielectric layer, a second barrier layer arranged on the second diffusion layer, a second work function adjustment layer arranged on the second barrier layer, a third work function adjustment layer arranged on the second work function adjustment layer, and a fourth barrier layer arranged on the third work function adjustment layer.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION

Figure 1:
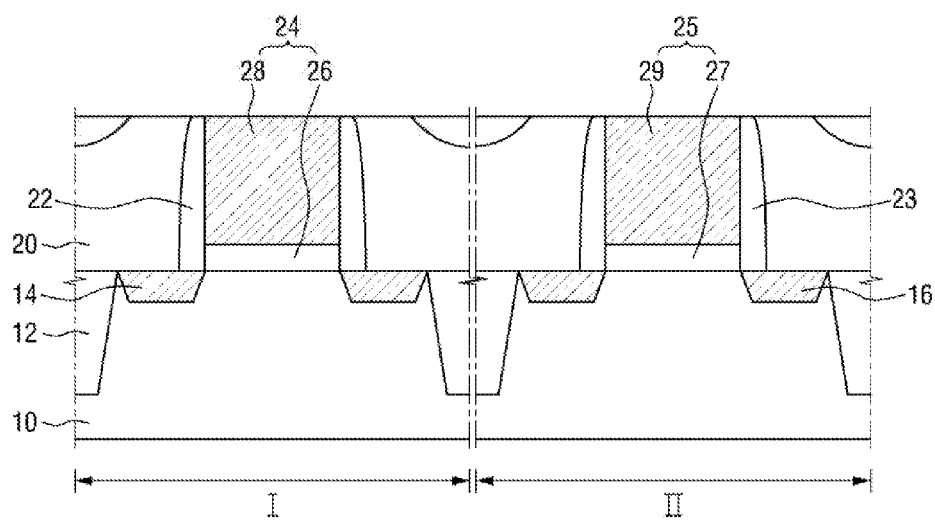
FIGS. 1 to 9 are cross-sectional views explaining a method for fabricating a semiconductor device 1 according to one embodiment of the present inventive concept.

Advantages and features of the present inventive concept and methods of accomplishing the same may be understood more readily by reference to the following detailed description of various embodiments and the accompanying drawings. The present inventive concept may, however, be embodied in many different forms and should not be construed as being limited to the embodiments set forth herein. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, or as contacting another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, referring to FIGS. 1 to 9, a method for fabricating a semiconductor device 1 according to an embodiment of the present inventive concept will be described. FIGS. 1 to 9 are cross-sectional views explaining a method for fabricating a semiconductor device 1 according to an embodiment of the present inventive concept.

As used herein, a semiconductor device may refer to any of the various devices such as shown in FIGS. 1-9, as well as FIGS. 10-38, and may also refer, for example, to one or more transistors, or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices, and/or logic devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIG. 1, a substrate 10 is provided. The substrate 10 may include a first region I and a second region II. The first region I and the second region II may be connected to each other (e.g., may be directly adjacent to each other), or may be apart from each other. For example, the first region I may be an NFET region where an N-type transistor is formed, and the second region II may be a PFET region where a P-type transistor is formed, but these regions are not limited thereto.

An isolation layer 12, such as STI (Shallow Trench Isolation), is formed in the substrate 10 to define an active region. The substrate 10 may be made of at least one semiconductor material selected from the group including Si, SiGe, GaP, GaAs, SiC, SiGeC, InAs, and InP. Further, the substrate 10 may be an SOI (Silicon On Insulator) substrate.

Then, a first dummy gate structure 24 is formed in the first region I, and a second dummy gate structure 25 is formed in the second region II. The first and second dummy gate structures 24 and 25 may include first and second dummy gate insulating layers 26 and 27 and first and second dummy gate electrodes 28 and 29, respectively. The first and second dummy gate insulating layers 26 and 27 may be formed on the substrate 10, and may be, for example, silicon oxide layers. The first and second dummy gate electrodes 28 and 29 may be formed on the first and second dummy gate insulating layers 26 and 27, respectively. The first and second dummy gate electrodes 28 and 29 may include, for example, polysilicon.

Then, first and second source/drain regions 14 and 16 are formed on the substrate 10 using the first and second dummy gate structures 24 and 45 as masks. The first source/drain region 14 is formed in the first region I, and the second source/drain region 16 is formed in the second region II. The first and second source/drain regions 14 and 16 may be formed at least on one side of the first and second dummy gate structures 24 and 25. Specifically, the first source/drain region 14 may be formed between the isolation layer 12 and the first dummy gate structure 24, and the second source/drain region 16 may be formed between the isolation layer 12 and the second dummy gate structure 26. A source/drain region may be formed at each side of each dummy gate structure for each region (e.g., at opposite sides of each dummy gate structure). A channel region on a lower portion of the first dummy gate structure 24 may be a region where N-type carriers that are included in the first source/drain region 14 move, and a channel region on a lower portion of the second dummy gate structure 26 may be a region where P-type carriers that are included in the second source/drain region 16 move.

First and second spacers 22 and 23 are formed on side walls of the first and second dummy gate structures 24 and 25. Though only one first spacer 22 and one second spacer 23 are labeled in FIG. 1, each dummy gate structure may include a first spacer 22 at one side and a second spacer 23 at a second, opposite side. The first and second spacers 22 and 23 may include, for example, silicon oxide or silicon nitride. The first and second spacers 22 and 23 may be formed on the side walls of the first dummy gate structure 24 and the second dummy gate structure 25 by forming a spacer layer (not illustrated) through a CVD process and then performing etch-back of the spacer layer. In this case, the shape of the first and second spacers 22 and 23 is not limited to that as described above.

Then, an interlayer insulating layer 20 is formed on the substrate 10. The interlayer insulating layer 20 may cover side walls of the first and second spacers 22 and 23 and may expose (e.g., by not covering) upper surfaces of the first and second dummy gate structures 24 and 25 with respect to the interlayer insulating layer 20. In order to expose the upper surfaces of the first and second dummy gate structures 24 and 25, a planarization process may be performed after the interlayer insulating layer 20 is formed. Unlike that as illustrated, the interlayer insulating layer 20 may be formed by stacking two or more insulating layers.

Figure 2:
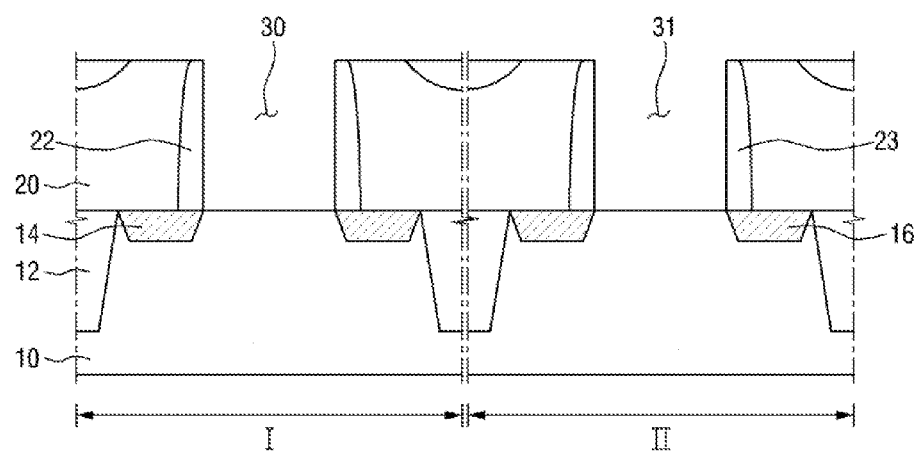

Referring to FIG. 2, the interlayer insulating layer 20, which includes a first trench 30 formed in the first region I and a second trench 31 formed in the second region II, is formed. The first trench 30 may be formed through removal of the first dummy gate structure 24, and the second trench 31 may be formed through removal of the second dummy gate structure 25.

The first trench 30 may expose the side walls of the first spacer 22 (e.g., opposite side walls) and the upper surface of the substrate 10, and the second trench 31 may expose the side walls of the second spacer 23 (e.g., opposite side walls) and the upper surface of the substrate 10.

Figure 3:
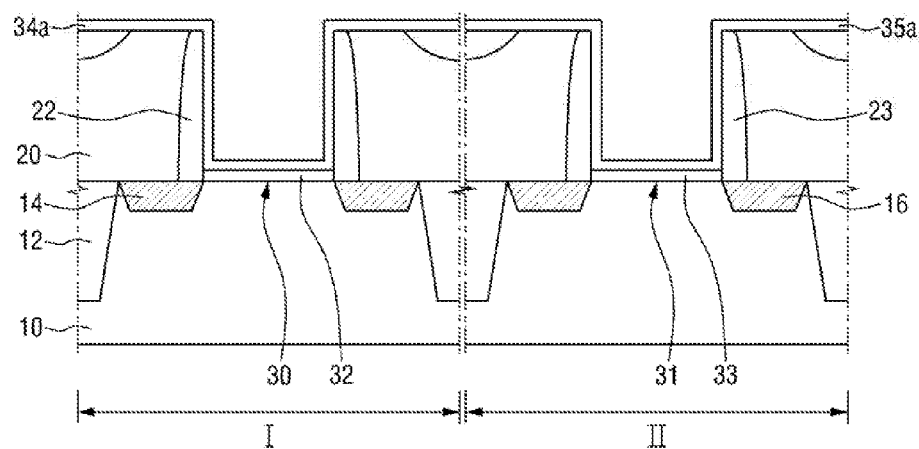

Referring to FIG. 3, a first interface layer 32 is formed on the upper surface of the substrate 10 in the first trench 30, and a second interface layer 33 is formed on the upper surface of the substrate 10 in the second trench 31.

The first and second interface layers 32 and 33 may be formed through oxidization of the exposed upper surface of the substrate 10 in the first and second trenches 30 and 31, but are not limited thereto. The first and second interface layers 32 and 33 may be formed along bottom surfaces of the first and second trenches 30 and 31, respectively. The first and second interface layers 32 and 33 may serve to prevent inferior interfaces between the substrate 10 and first and second high-k layers 34a and 35a. The first and second interface layers 32 and 33 may include low-k material layers of which the dielectric constant is equal to or smaller than 9, for example, a silicon oxide layer (where, k is about 4) or a silicon oxynitride layer (where, k is about 4 to 8 depending on the oxygen atom content and the nitrogen atom content). Further, the first and second interface layers 32 and 33 may be made of silicate or may be a combination of the above-exemplified layers.

Then, the first high-k layer 34a is formed in the first trench 30, and the second high-k layer 35a is formed in the second trench 31. Specifically, the first high-k layer 34a may be conformally formed along the side walls and the lower surface of the first trench 30, and the second high-k layer 35a may be conformally formed along the side walls and the bottom surface of the second trench 31. Also, the first and second high-k layers 34a and 35a may be formed even on the interlayer insulating layer 20. The first and second high-k layers 34a and 35a may be high-k dielectric layers that include a high-k material having higher dielectric constant than a silicon oxide layer. For example, the first and second high-k layers 34a and 35a may include a material selected from the group including HFSiON, $HfO_2$, $ZrO_2$, $Ta_2O_5$, $TiO_2$, $SrTiO_3$, and $(Ba,Sr)TiO_3$. The first and second high-k layers 34a and 35a may be formed with an appropriate thickness according to the kind of a device to be formed.

Figure 4:
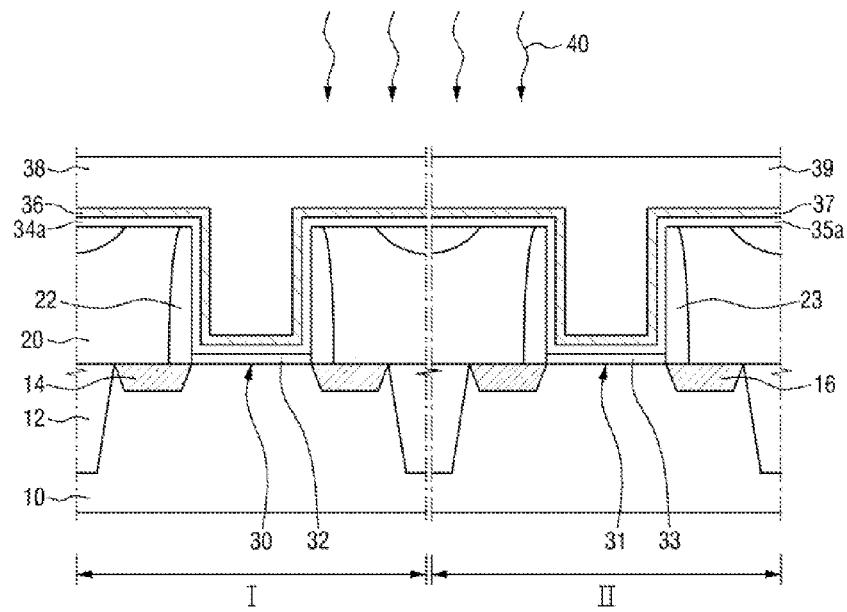

Referring to FIG. 4, first and second diffusion layers 36 and 37 and first and second blocking layers 38 and 39 are successively formed. The first diffusion layer 36 is formed in the first trench 30, and the second diffusion layer 37 is formed in the second trench 31. The first and second diffusion layers 36 and 37 may be conformally formed along the side walls and the bottom surfaces of the first and second trenches 30 and 31. The first and second diffusion layers 36 and 37 may include, for example, TiN, but are not limited thereto.

Then, the first and second blocking layers 38 and 39 are formed on the first and second diffusion layers 36 and 37. The first and second blocking layers 38 and 39 may fill the first and second trenches 30 and 31, and may cover the first and second diffusion layers 36 and 37 to prevent the first and second diffusion layers 36 and 37 from being exposed to an outside (e.g. the first and second diffusion layers 36 and 37 may be covered on one side by first and second high-k layers 34a and 35a, and may be covered on an opposite side by first and second blocking layers 38 and 39. The first and second blocking layers 38 and 39 may include, for example, Si.

Then, annealing 40 is performed. In certain embodiments, the first and second high-k layers 34a and 35a include oxygen atoms. The oxygen atoms are bonded with other materials (e.g., HF, Zr, Ta, and Ti), and such bonding may be partially in a broken state. If the bonding is broken, leakage current may occur to deteriorate the performance of a transistor. To prevent this problem, the annealing 40 is performed to bond the oxygen atoms in a portion where the bonding is broken. When the annealing 40 is performed, the oxygen atoms included in the first and second diffusion layers 36 and 37 are provided to the first and second high-k layers 34a and 35a.

On the other hand, if the first and second diffusion layers 36 and 37 are exposed during the annealing 40 (e.g., if the first and second blocking layers 38 and 39 are not used), external oxygen atoms may penetrate into the first and second diffusion layers 36 and 37, and the number of oxygen atoms that move to lower portions of the first and second diffusion layers 36 and 37 is increased. If the number of oxygen atoms being supplied exceeds the number of oxygen atoms that are needed in the first and second high-k layers 34a and 35a, the excessive oxygen atoms may react on the substrate 10 in the first and second trenches 30 and 31. Accordingly, the first and second interface layers 32 and 33 may be thickened to deteriorate the performance of the transistor. In this case, the supply amount of oxygen atoms may be appropriately adjusted by blocking the first and second diffusion layers 36 and 37 from an outside through forming of the first and second blocking layers 38 and 39 on the first and second diffusion layers 36 and 37 during the annealing 40.

The annealing 40 may be performed, for example, at a temperature of about 500° C. to about 1500° C.

The thickness of the first and second diffusion layers 36 and 37 may differ depending on the number of oxygen atoms to be supplied.

Figure 5:
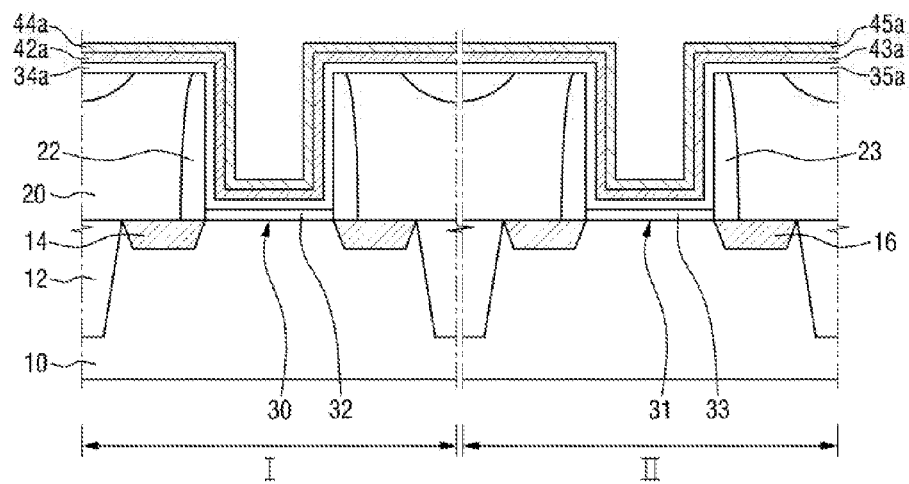

Referring to FIG. 5, the first and second blocking layers 38 and 39 and the first and second diffusion layers 36 and 37 are successively removed, and thus the first and second high-k layers 34a and 35a may be exposed again. Then, first and second barrier layers 42a and 43a are formed on the first and second high-k layers 34a and 35a. The first and second barrier layers 42a and 43a may be conformally formed along the side walls and the bottom surfaces of the first and second trenches 30 and 31. The first and second barrier layers 42a and 43a may have a thickness of about 3 Å to about 30 Å. Further, in certain embodiments, the first and second barrier layers 42a and 43a may include a material that is different from the material of the first and second diffusion layers 36 and 37, for example, at least one of TaN, TaNO, TaSiN, and TiSiN.

Then, first work function adjustment layers 44a and 45a are formed on the first and second barrier layers 42a and 43a. The first work function adjustment layers 44a and 45a may be conformally formed along the side walls and the bottom surfaces of the first and second trenches 30 and 31. The first work function adjustment layers 44a and 45a may be a first type, such as P-type work function adjustment layers, and may include, for example, TiN.

Figure 6:
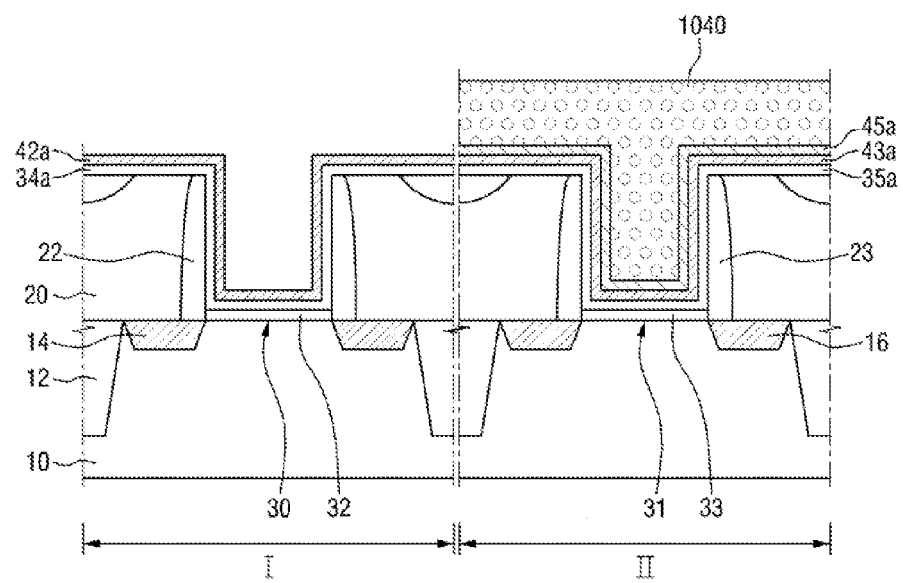

Referring to FIG. 6, a mask 1040 is formed on the first work function adjustment layer 45a in the second region II. The mask 1040 may cover the second trench 31, and may expose the first trench 30 (e.g., may not cover the first trench 30).

Then, the first work function adjustment layer 44a in the first region I is removed using the mask 1040. Accordingly, the first work function adjustment layer 44a is not arranged in the first trench 30. The first barrier layer 42a is not removed, and may protect the first high-k layer 34a when the first work function adjustment layer 44a is removed. After the first work function adjustment layer 44a in the first region I is removed, the mask 1040 in the second region II is removed.

Figure 7:
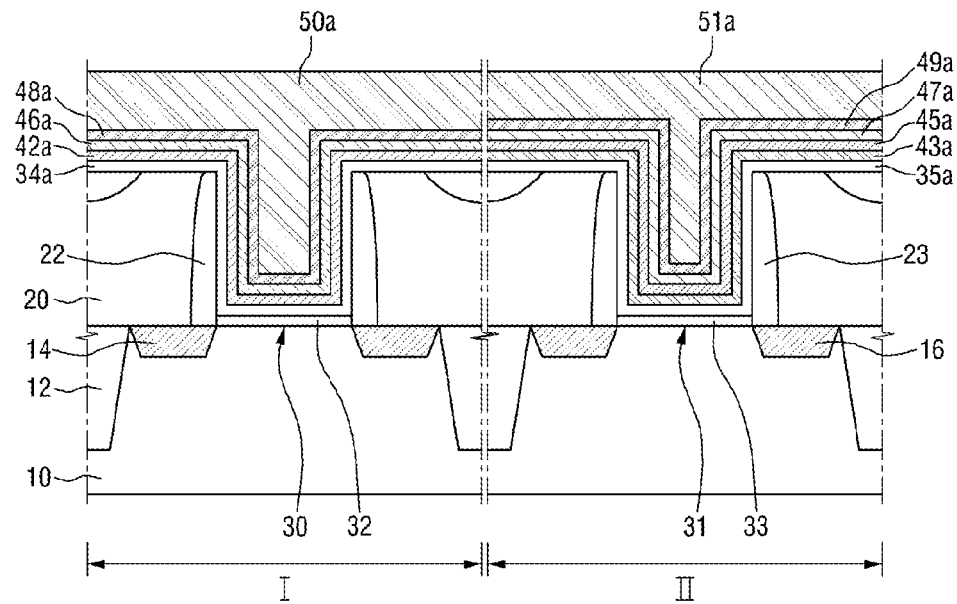

Referring to FIG. 7, second work function adjustment layers 46a and 47a are formed in the first region I and the second region II. The second work function adjustment layers 46a and 47a may be conformally formed along the side walls and the bottom surfaces of the first and second trenches 30 and 31. The second work function adjustment layers 46a and 47a may be formed to come in contact with the first barrier layer 42a in the first trench 30, and may be formed to come in contact with the first work function adjustment layer 45a in the second trench 31. The second work function adjustment layers 46a and 47a may be the same type (e.g., P-type) work function adjustment layers as the first work function adjustment layers 44a and 45a. In one embodiment, the second work function adjustment layers 46a and 47a are formed of a different material from the first work function adjustment layers 44a and 45a. The second work function adjustment layers 46a and 47a may include, for example, at least one of TiAl, TiAlC, TiAlN, TaC, TiC, and HfSi.

In the second region II, the second work function adjustment layer 47a may be stacked on the first work function adjustment layer 45a to arrange two work function adjustment layers therein. The first work function adjustment layer 45a that is arranged on the lower portion of the second trench 31 serves to adjust the operation characteristics of the transistor through adjustment of the work function of the transistor. Accordingly, the transistor in the second region II may operate as a P-type transistor. In one embodiment, the transistor in the first region I may operate as an N-type transistor through the second work function adjustment layer 46a.

Then, third and fourth barrier layers 48a and 49a are formed on the second work function adjustment layers 46a and 47a. Specifically, the third barrier layer 48a may be conformally formed along the side wall and the bottom surface of the first trench 30, and the fourth barrier layer 49a may be conformally formed along the side wall and the bottom surface of the second trench 31. The third and fourth barrier layers 48a and 49a may include, for example, TiN. The third and fourth barrier layers 48a and 49a may prevent a material that is included in first and second gate metals 50a and 51a from being diffused in the first and second trenches 30 and 31.

The first and second gate metals 50a and 51a are formed on the third and fourth barrier layers 48a and 49a. The first and second gate metals 50a and 510a may fill the remaining portions of the first and second trenches 30 and 31. The first and second gate metals 50a and 51a may include, for example, Al or W.

Figure 8:
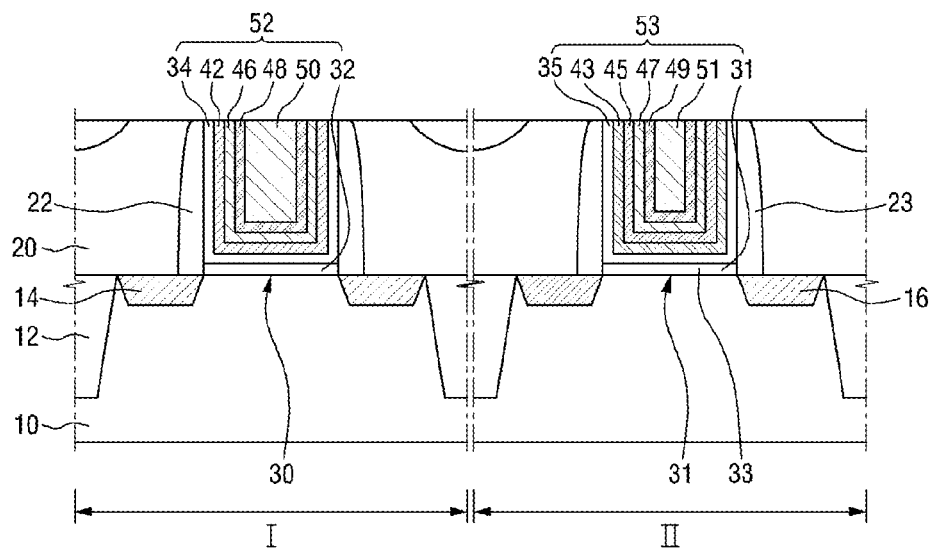

Referring to FIG. 8, first and second gate structures 52 and 53 are formed. If a planarization process is performed to expose the interlayer insulating layer 20, the first gate structure 52, which includes the first interface layer 32, the first high-k layer 34, the first barrier layer 42, the second work function adjustment layer 46, the third barrier layer 48, and the first gate metal 50, may be formed in the first region I, and the second gate structure 53, which includes the second interface layer 33, the second high-k layer 35, the second barrier layer 47, the first and second work function adjustment layers 45 and 47, the fourth barrier layer 49, and the second gate metal 51, may be formed in the second region II. The first and second high-k layers 34 and 35, the first and second barrier layers 42 and 43, the first work function adjustment layer 45, the second work function adjustment layers 46 and 47, and the third and fourth barrier layers 48 and 49 may be in a concave shape in the first and second trenches 30 and 31. Therefore, as shown, the first gate structure 52 includes only the second work function adjustment layer (e.g., 46a), while the second gate structure 53 includes both the second work function adjustment layer (e.g., 47a) and the first work function adjustment layer (e.g., 45a).

Figure 9:
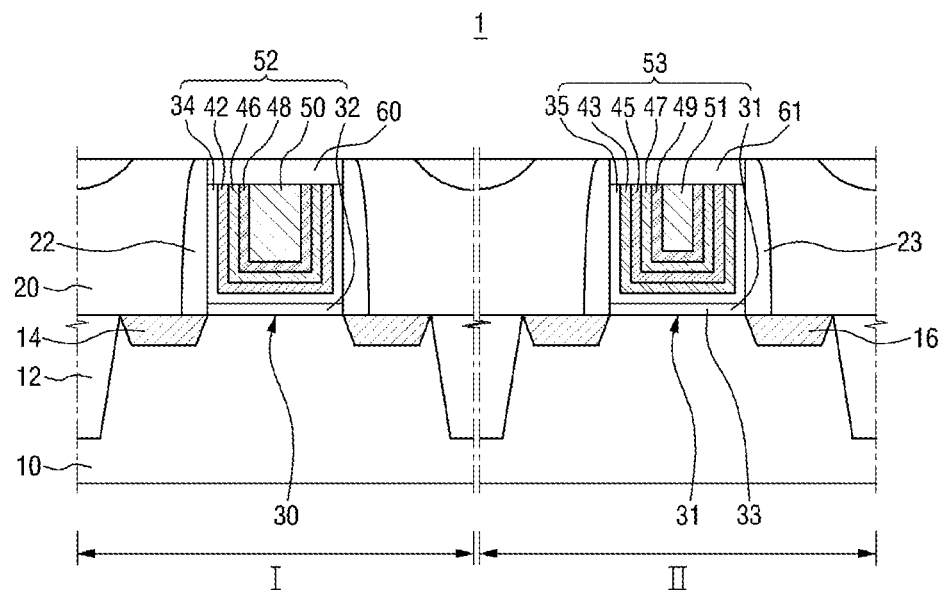

Referring to FIG. 9, first and second capping layers 60 and 61 may be formed on the first and second gate metals 52 and 53, respectively, to form the semiconductor device 1. For example, the semiconductor device 1 may include at least two transistor structures of opposite type. Specifically, the first and second capping layers 60 and 61 are formed on the first and second gate metals 50 and 51 and may cover the first and second trenches 30 and 31, respectively. The first and second capping layers 60 and 61 may be nitride layers (e.g., at least one of SiN, SiON, and SiCON) or oxide layers, for example. The first and second capping layers 60 and 61 may block the first and second gate structures 52 and 53 from an outside to prevent the performance change of the first and second gate structures 52 and 53. If the first and second gate structures 52 and 53 remain exposed, oxygen atoms may penetrate into the first and second gate structures 52 and 53, and in this case, the threshold voltages of the first and second gate structures 52 and 53 may be changed. Accordingly, the first and second capping layers 60 and 61 may be formed to keep the threshold voltages of the first and second gate structures 52 and 53 constant. In certain embodiments, the thickness of the first and second capping layers 60 and 61 may be, for example, about 5 Å to about 500 Å.

Before the first and second capping layers 60 and 61 are formed, parts of the first and second gate structures 52 and 53 may be removed to adjust the height of the first and second gate structures 52 and 53. Accordingly, the first and second high-k layers 34 and 35, the first and second barrier layers 42 and 43, the first and second work function adjustment layers 45, 46, and 47, the third and fourth barrier layers 48 and 49, and the first and second gate metals 50 and 51 in the first and second trenches 30 and 31 may be partially removed. In this case, side walls of the first and second capping layers 61 and 62 may come in contact with the side walls of the first and second spacers 22 and 23. Further, upper surfaces of the first and second capping layers 60 and 61 may be arranged on the same plane as the interlayer insulating layer 20.

The threshold voltages of the first and second gate structures 52 and 53 may be adjusted through adjustment of the height of the first and second gate structures 52 and 53.

In the method for fabricating a semiconductor device 1 according to one embodiment of the present inventive concept, after the annealing 40 is performed, the first and second diffusion layers 36 and 37 are removed, and the first and second barrier layers 42a and 43a are formed. If the first and second diffusion layers 36 and 37 are removed, inner spaces of the first and second trenches 30 and 31 may be increased as much as the removed portions. Further, if the first and second barrier layers 42a and 43a are formed after the first and second diffusion layers 36 and 37 are removed, tunneling effects of the first and second gate structures 52 and 53 may be improved, and the amount of leakage current may be improved. In certain experiments, the amount of leakage current was improved over 10 times with the use of this method and structure compared to the conventional method and structure of forming first and second gate structures.

Referring to FIGS. 1 to 8, and 10, a method for fabricating a semiconductor device 2 according to another embodiment of the present inventive concept will be described. Explanation of the duplicate contents as described above will be omitted, and the explanation will be made around the different point between this embodiment and the above-described embodiment.

Figure 10:
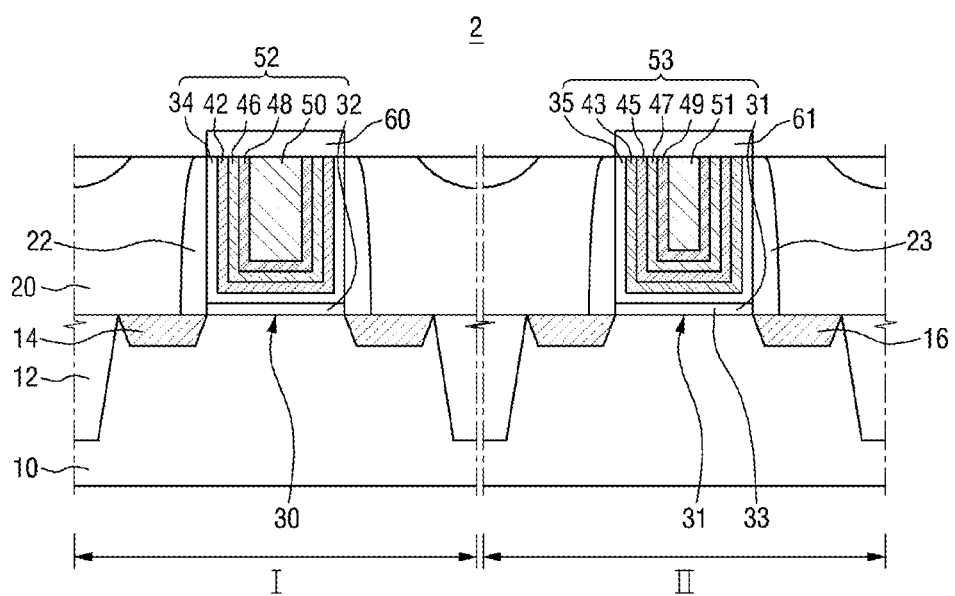
FIG. 10 is a cross-sectional view explaining a method for fabricating a semiconductor device 2 according to another embodiment of the present inventive concept.

FIG. 10 is a cross-sectional view explaining a method for fabricating a semiconductor device 2 according to another embodiment of the present inventive concept.

Since FIGS. 1 to 8 are the same as those described above, the explanation thereof will be omitted.

Referring to FIG. 10, the first capping layer 60 is formed on the first gate structure 52, and the second capping layer 61 is formed on the second gate structure 53. In this case, unlike the semiconductor device 1 of FIG. 9, the first and second capping layers 60 and 61 may be formed while the first and second gate structures 52 and 53 are kept as they are. The first and second capping layers 60 and 61 covers the upper surface of the first and second gate structures 52 and 53 to block the first and second gate structures 52 and 53 from the outside. In the semiconductor device 2 of FIG. 10, the first and second capping layers 60 and 61 may be formed without partially removing the first and second gate structures 52 and 53. The first and second capping layers 60 and 61 may respectively cover the upper surfaces of the first and second gate structures 52, and 53.

The first and second capping layers 60 and 61 may be nitride layers (e.g., at least one of SiN, SiON, and SiCON) or oxide layers, for example. The first and second capping layers 60 and 61 may block the first and second gate structures 52 and 53 from the outside to prevent the performance change of the first and second gate structures 52 and 53. The thickness of the first and second capping layers 60 and 61 may be, for example, about 5 Å to about 500 Å.

Referring to FIGS. 1 to 6, 11, and 12, a semiconductor device 3 according to still another embodiment of the present inventive concept will be described. Explanation of the duplicate contents as described above will be omitted, and the explanation will be made around the different point between this embodiment and the above-described embodiment.

Figure 11:
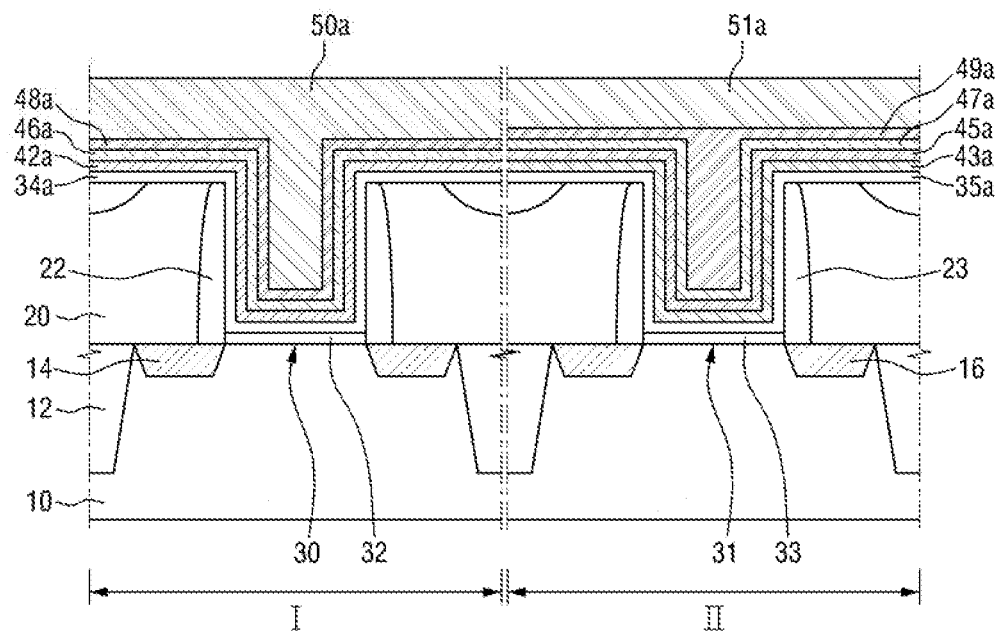
FIGS. 11 and 12 are cross-sectional views explaining a semiconductor device 3 according to still another embodiment of the present inventive concept.
Figure 12:
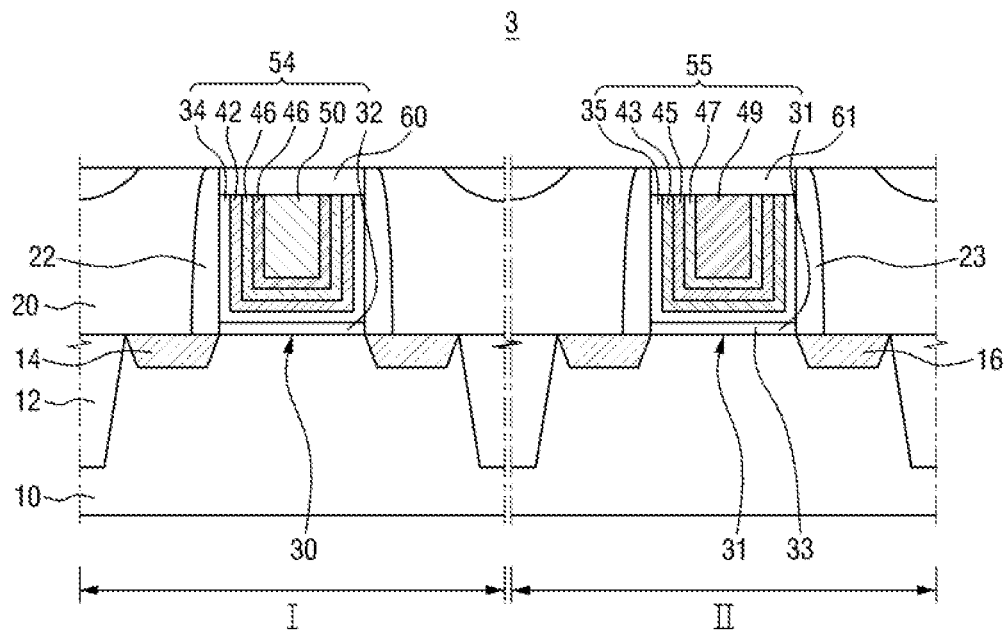

FIGS. 11 and 12 are cross-sectional views explaining a semiconductor device 3 according to still another embodiment of the present inventive concept.

Since FIGS. 1 to 6 are the same as those described above, the explanation thereof will be omitted.

Referring to FIG. 11, after the mask pattern 1040 is removed, the second work function adjustment layers 46a and 47a, the third and fourth barrier layers 48a and 49a, and the first and second gate metals 50a and 51a are successively formed. In this case, unlike the semiconductor device 1 of FIG. 7, the second gate metal 51a may not fill the second trench 31. This is because the width between the second spacers 23 of the second region II may be narrow, and unlike the first region I, the first work function adjustment layer 45a is formed in the second trench 31 of the second region II. Accordingly, the fourth barrier layer 49a that is formed on the second work function adjustment layer 47a fills the second trench 31, and the second gate metal 51a is formed on the fourth barrier layer 47a.

Then, a planarization process to expose the interlayer insulating layer 20 is performed to form the third and fourth gate structures 54 and 55. At this time, the second gate metal 51a formed on the fourth barrier layer 49a is entirely removed. Then, the first capping layer 60 is formed on the third gate structure 54, and the second capping layer 61 is formed on the fourth gate structure 55 so as to form the semiconductor device 3 of FIG. 12. Unlike the second gate structure 53 of FIG. 9, the fourth gate structure 55 does not include the second gate metal 51. Thus, in the second gate structure 53 of FIG. 9, the gate metal 51 serves as a gate conductor (also referred to as a gate line) for the gate structure, whereas in the fourth gate structure 55 of FIG. 12, the fourth barrier layer 49a serves as the gate conductor for the gate structure.

Since the first work function adjustment layer 45 is not formed on the third gate structure 54 and the gate metal 51 is not formed on the fourth gate structure 55, the number of layers included in the third gate structure 54 may be equal to the number of layers included in the fourth gate structure 55. FIG. 12 illustrates that each of the third and fourth gate structures 54 and 55 includes 6 layers, but are not limited thereto. The number of layers included in the third or fourth gate structure may be larger or smaller than 6.

Referring to FIGS. 1 to 4, 13, and 14, a semiconductor device 4 according to still another embodiment of the present inventive concept will be described. Explanation of the duplicate contents as described above will be omitted, and the explanation will be made around the different point between this embodiment and the above-described embodiment.

Figure 13:
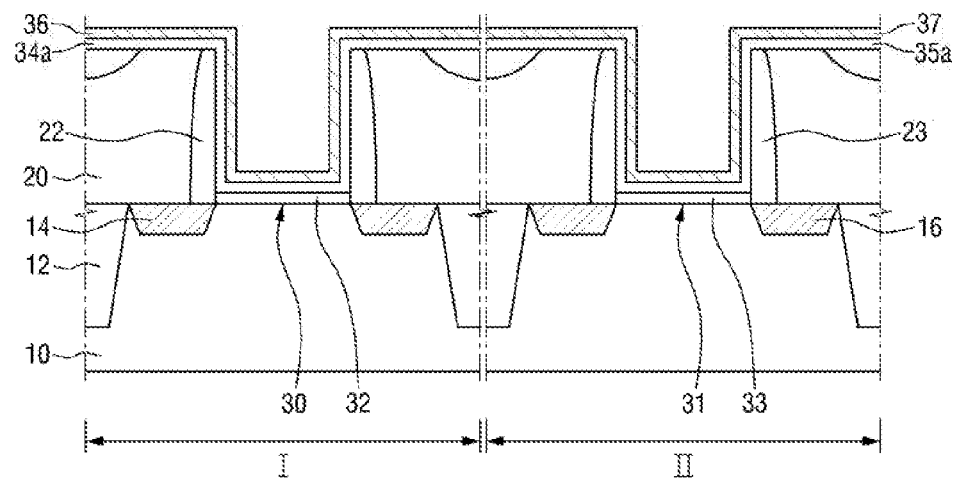
FIGS. 13 and 14 are cross-sectional views explaining a semiconductor device 4 according to still another embodiment of the present inventive concept.
Figure 14:
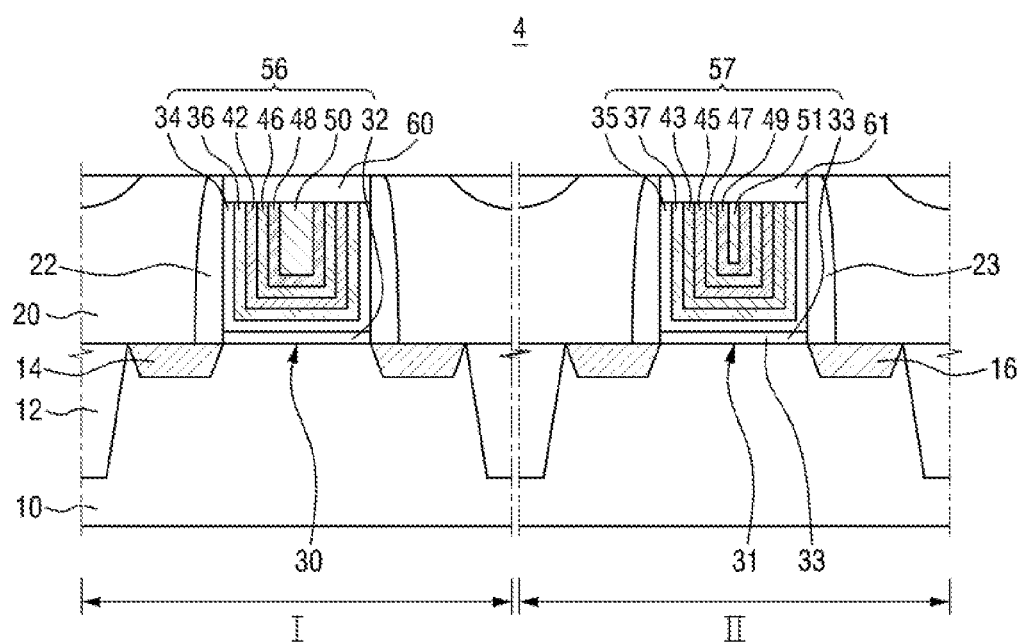

FIGS. 13 and 14 are cross-sectional views explaining a semiconductor device 4 according to still another embodiment of the present inventive concept.

Since FIGS. 1 to 4 are the same as those described above, the explanation thereof will be omitted.

Referring to FIG. 13, the first and second blocking layers 38 and 39 are removed. Unlike the semiconductor device 1 of FIG. 9, the first and second diffusion layers 36 and 37 may not be removed. Accordingly, the first and second diffusion layers 36 and 37 may exist in the first and second trenches 30 and 31, respectively.

The fabricating process illustrated in FIGS. 5 to 8 is performed in a state where the first and second diffusion layers 36 and 37 remain so as to form a fifth gate structure 56 and a sixth gate structure 57. Further, the first and second capping layers 60 and 61 are formed on the fifth and sixth gate structures 56 and 57 to form a semiconductor device 4 of FIG. 14. The fifth and sixth gate structures 56 and 57 further include the first and second diffusion layers 36 and 37, respectively, in comparison to the first and second gate structures 52 and 53. The first diffusion layer 36 may be arranged between the first high-k layer 34 and the first barrier layer 42, and the second diffusion layer 37 may be arranged between the second high-k layer 35 and the first barrier layer 43.

Figure 15:
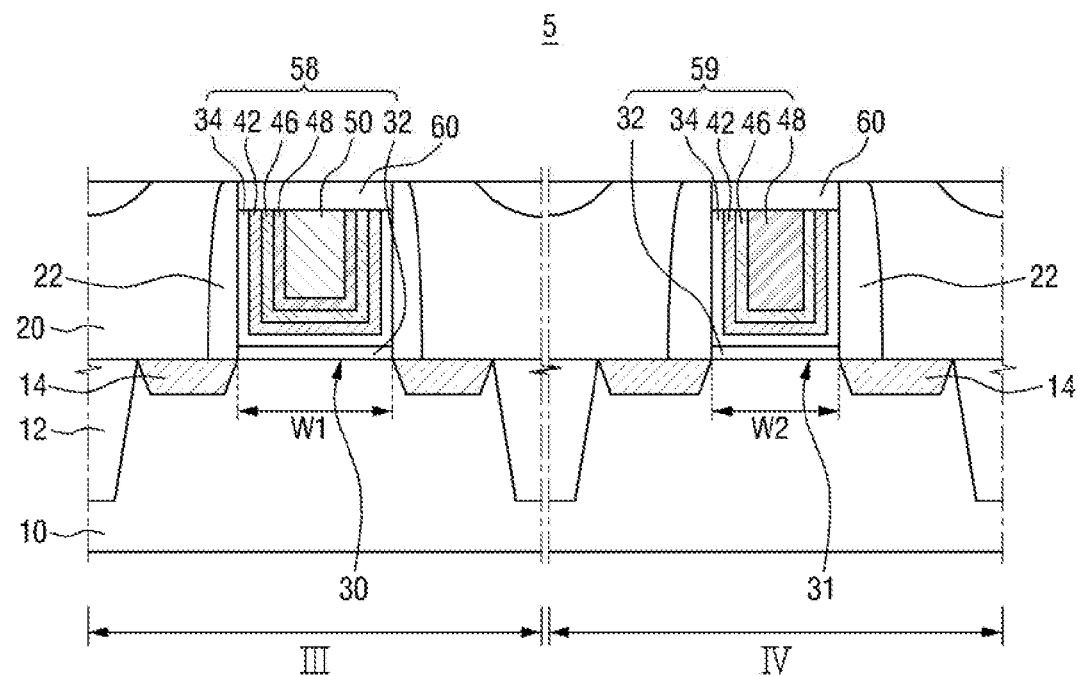
FIG. 15 is a cross-sectional view explaining a method for fabricating a semiconductor device 5 according to still another embodiment of the present inventive concept.

Referring to FIG. 15, a method for fabricating a semiconductor device 5 according to still another embodiment of the present inventive concept will be described. Explanation of the duplicate contents as described above will be omitted, and the explanation will be made around the different point between this embodiment and the above-described embodiment.

FIG. 15 is a cross-sectional view explaining a method for fabricating a semiconductor device 5 according to still another embodiment of the present inventive concept.

In the semiconductor device 5, the substrate 10 may include a third region III and a fourth region IV. The third region III and the fourth region IV may be connected to each other (e.g., directly adjacent to each other), or may be apart from each other. Here, the fourth region IV may be a region where a transistor that has a low threshold voltage and a high switching speed is formed, and the third region III may be a region where a transistor that has a high threshold voltage, a low switching speed, and high reliability is formed. For example, the fourth region IV may be a cell array region where a cell array, in which unit memory cells are gathered in the form of a matrix, is formed, and the third region III may be a core/peripheral region where peripheral circuits, which carry external data into the cell array or carry data of the cell array to an outside, are complicatedly formed. These regions may be formed, for example, on a semiconductor chip, such as a semiconductor memory chip formed from a wafer. However, the present inventive concept is not limited thereto.

Further, for example, the fourth region IV may be an SRAM region, and the third region III may be a logic region, but these regions are not limited thereto. For example, the fourth region IV may be a logic region, and the third region III may be a region where other memories are formed (e.g., a DRAM, an MRAM, a RRAM, and a PRAM).

A seventh gate structure 58 of the third region III may be formed in the same manner as the first region of FIGS. 1 to 9. Like the third region III, an eighth gate structure 59 of the fourth region IV may be formed in the same manner as the first region I of FIGS. 1 to 9. However, since the width W2 of the second trench 30 of the fourth region IV is narrower than the width W1 of the first trench 31 of the third region III, the first gate metal 50 may not be included therein. Specifically, referring to the first region I of FIG. 7, the second work function adjustment layer 46a, the third barrier layer 46a, and the first gate metal 50a may be successively stacked on a first barrier layer 42a (also described herein as a terminal effect improvement layer 42a), and the first gate metal 50a may fill the first trench 30. However, since the width W2 of the second trench 31 of the fourth region IV is narrower than the width W1 of the first trench 30, the second work function adjustment layer 46a, the third barrier layer 48a, and the first gate metal 50a may be successively stacked on the first terminal effect improvement layer 42a in the same manner, but the third barrier layer 46a fills the second trench 31 in a state where the first gate metal 50a is not formed in the second trench 31.

Then, a planarization process to expose the interlayer insulating layer 20 may be performed to form the seventh and eighth gate structures 58 and 59, and the capping layer 60 is formed on the seventh and eighth gate structures 58 and 59 to form the semiconductor device 5 of FIG. 15. During the planarization process, the first gate metal 50a of the fourth region IV may be entirely removed.

FIG. 15 illustrates that an N-type transistor is formed in both the third region III and the fourth region IV, but is not limited thereto. A P-type transistor may be formed in the third region III and the fourth region IV. In this case, the third region III may have the same shape as the second region II of FIG. 9, and the fourth region IV may have the same shape as the second region II of FIG. 12. However, the width of the gate structure in the fourth region IV is narrower than the width of the gate structure in the third region III.

Referring to FIGS. 16 to 33, a semiconductor device 6 according to still another embodiment of the present inventive concept will be described.

Figure 31:
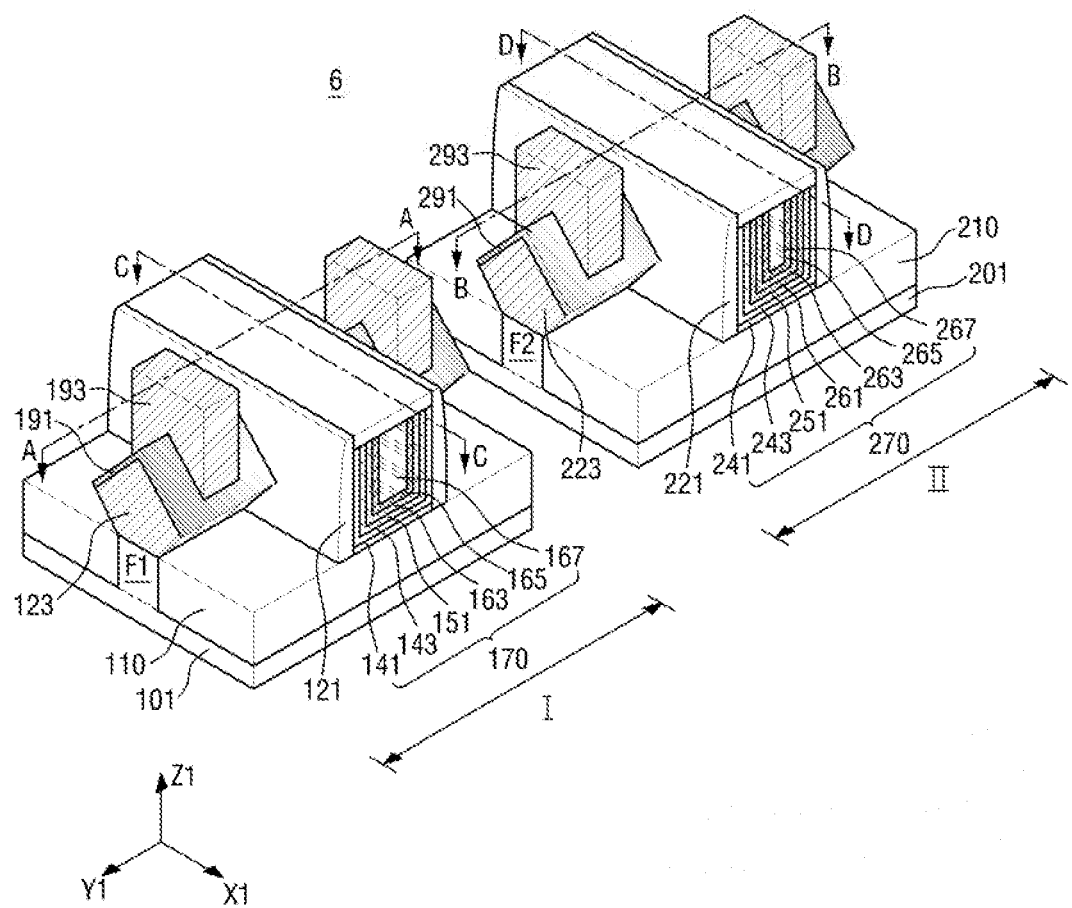
Figure 32:
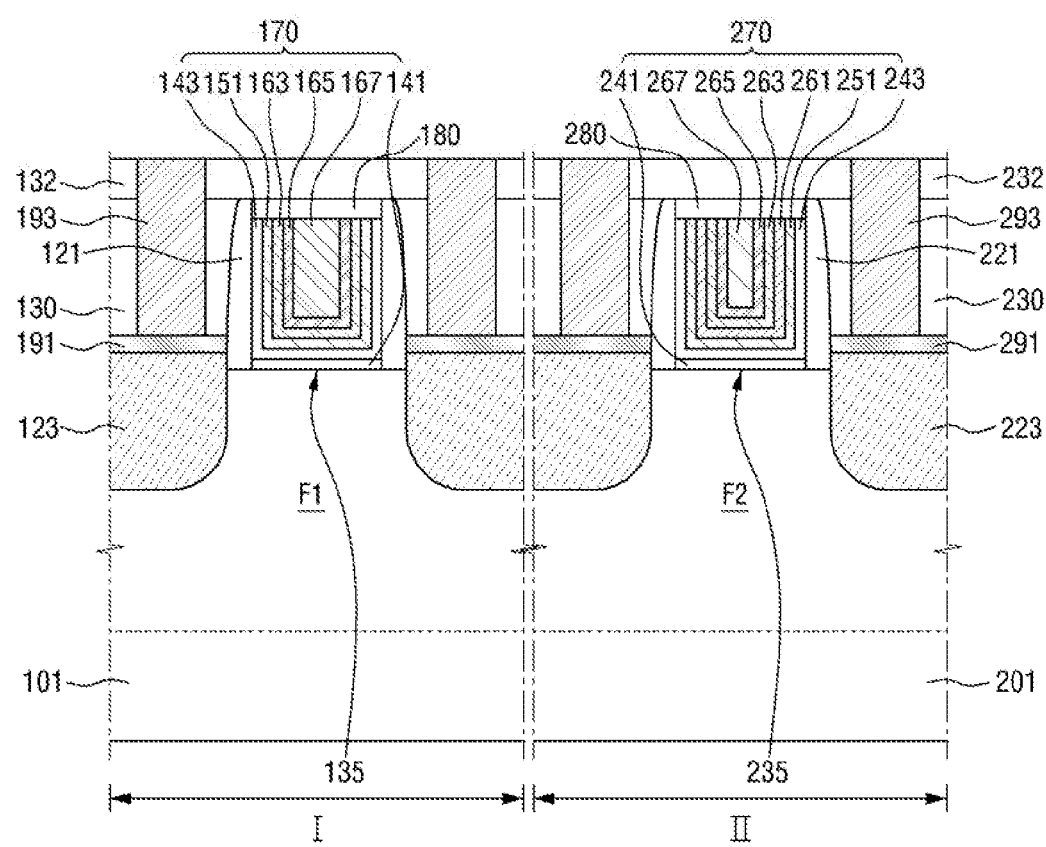
Figure 33:
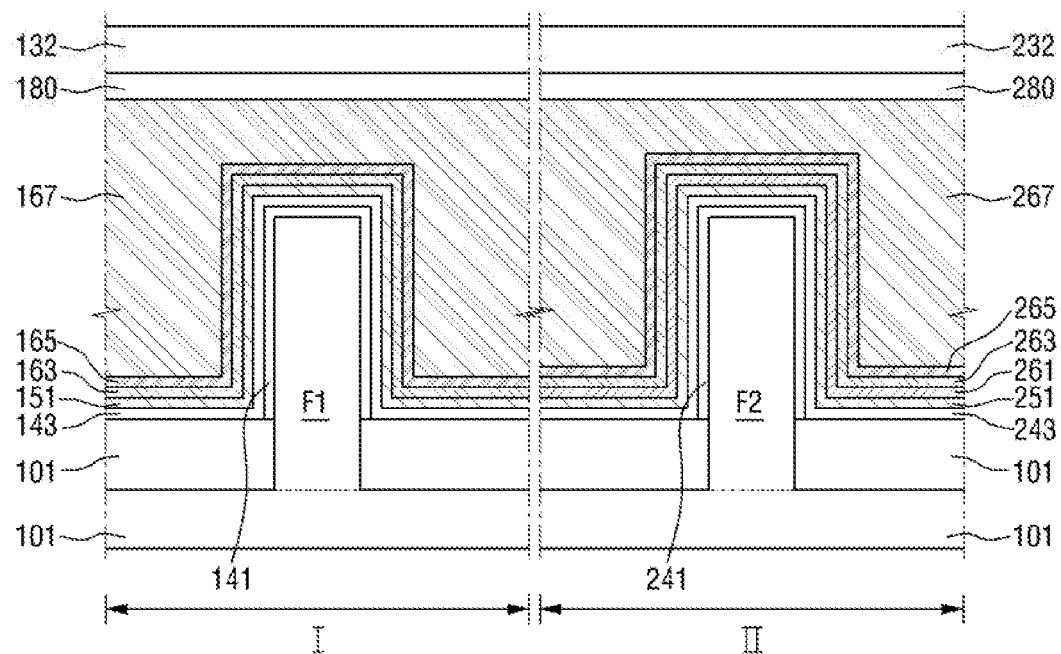

FIGS. 16 to 33 are views of intermediate steps explaining a method for fabricating a semiconductor device 6 according to still another embodiment of the present inventive concept. Specifically, FIGS. 16 to 19 and 31 are perspective views, FIGS. 20 to 30 are cross-sectional views taken along lines A-A and B-B of FIG. 19, FIG. 32 is a cross-sectional view taken along lines A-A and B-B of FIG. 19, and FIG. 33 is a cross-sectional view taken along lines C-C and D-D of FIG. 31. In FIG. 31, illustration of first interlayer insulating layers 130 and 230 and second interlayer insulating layers 132 and 232 is omitted.

Figure 16:
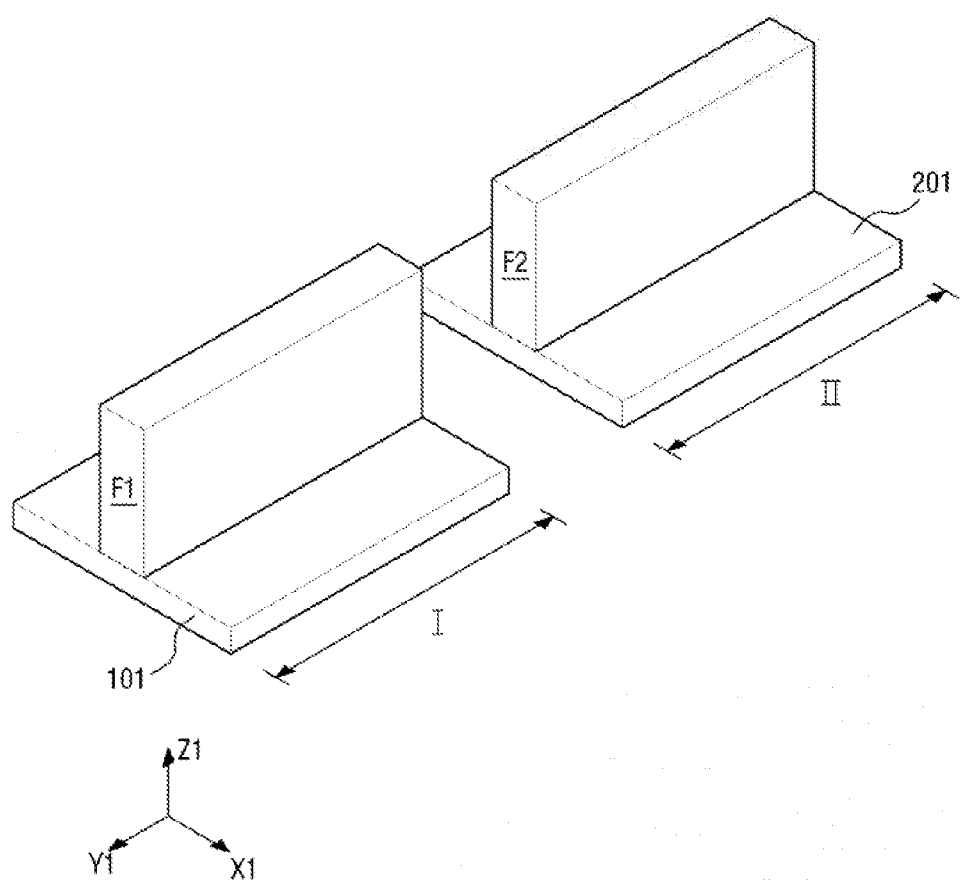
FIGS. 16 to 33 are views of intermediate steps explaining a method for fabricating a semiconductor device 6 according to still another embodiment of the present inventive concept.

First, referring to FIG. 16, a first fin F1 and a second fin F2 are respectively formed on substrates 101 and 201. A first region I and a second region II may be defined on the substrates 101 and 201. The first region I and the second region II may come in contact with each other, or may be apart from each other. For example, the first region I may be an NFET region where an N-type transistor is formed, and the second region II may be a PFET region where a P-type transistor is formed, but are not limited thereto.

The first fin F1 may be formed in the first region I, and the second fin F2 may be formed in the second region II. The first and second fins F1 and F2 may project in a third direction Z1. The first and second fins F1 and F2 may extend long along a second direction Y1 that is a length direction thereof, and may have long sides in the second direction Y1 and short sides in a first direction X1. However, the present inventive concept is not limited thereto, and for example, the long side direction may be the first direction X1 and the short side direction may be the second direction Y1.

The first and second fins F1 and F2 may be parts of the substrates 101 and 201, and may include, for example, epitaxial layers that are grown from the substrates 101 and 201. For example, the first and second fins may include Si or SiGe.

Figure 17:
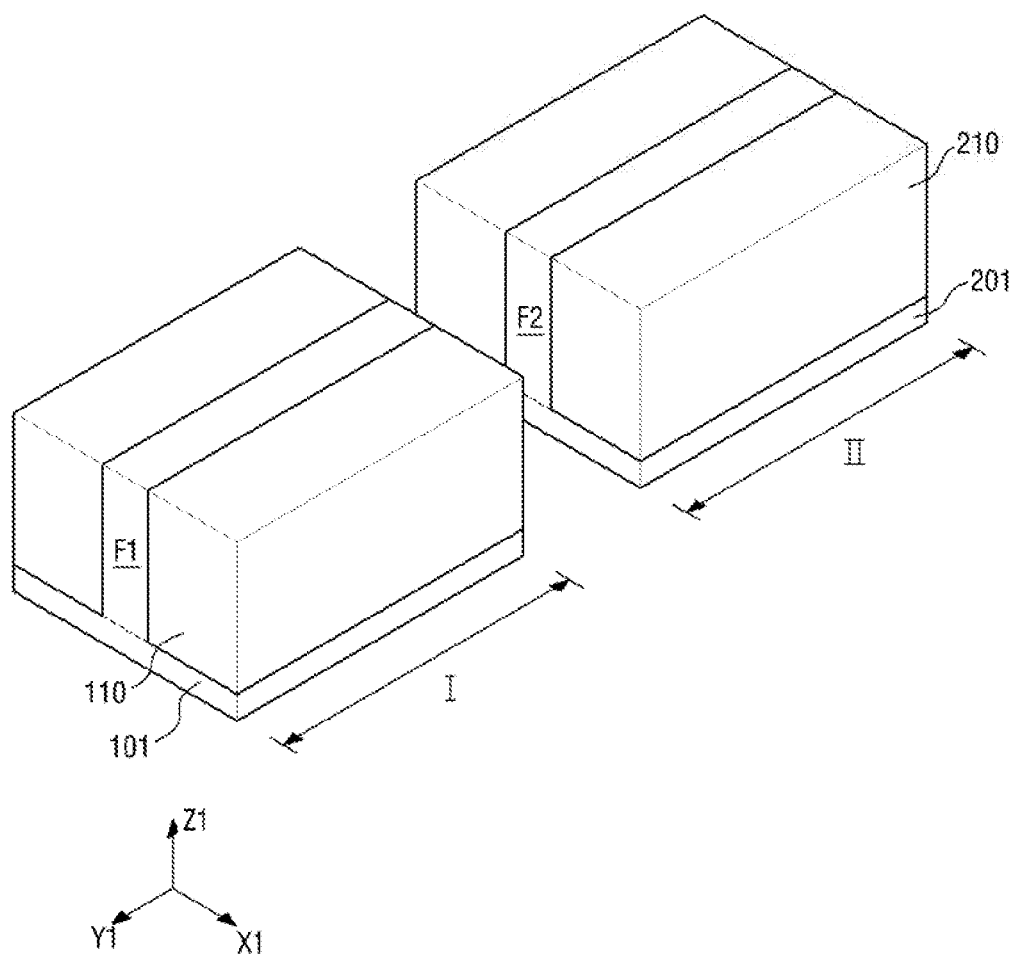

Referring to FIG. 17, field insulating layers 110 and 210 are formed on the substrates 101 and 201 to cover side walls of the first and second fins F1 and F2. For example, the field insulating layers 110 and 210 may be formed of a material that includes at least one of a silicon oxide layer, a silicon nitride layer, and a silicon oxynitride layer.

Figure 18:
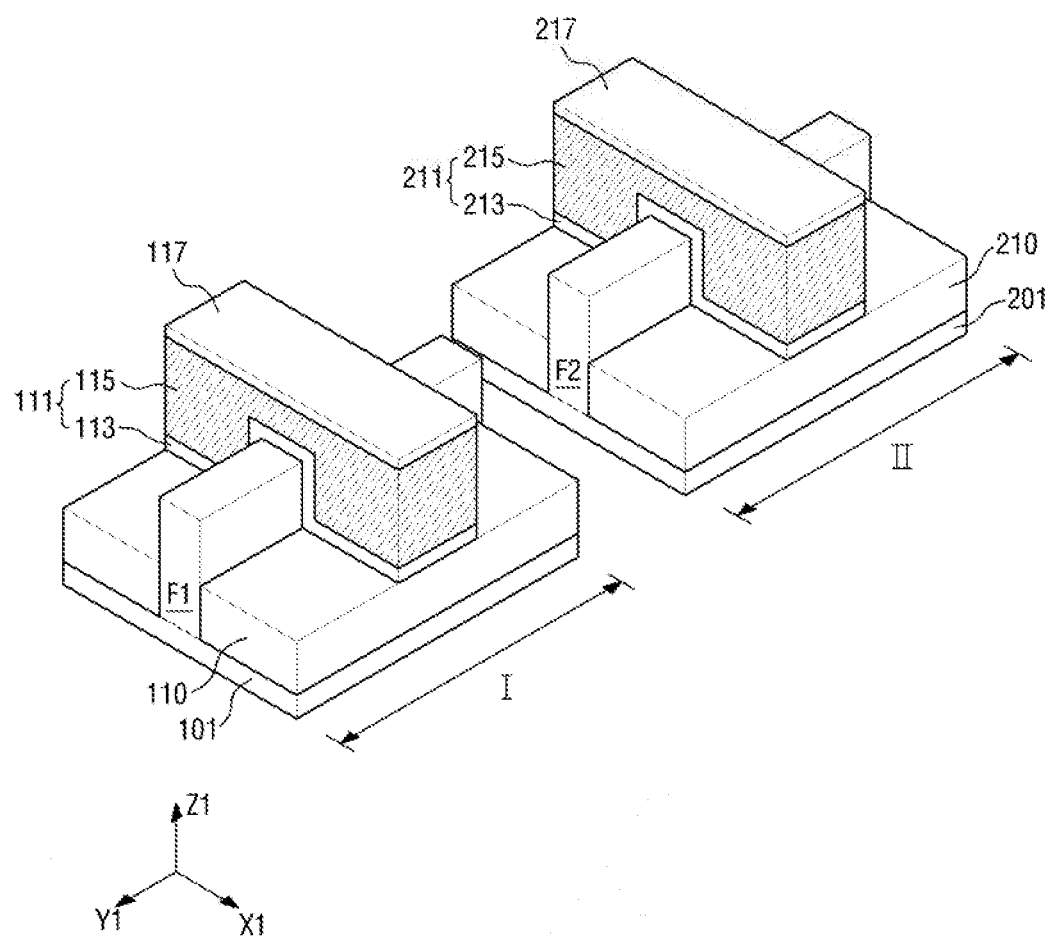
Figure 19:
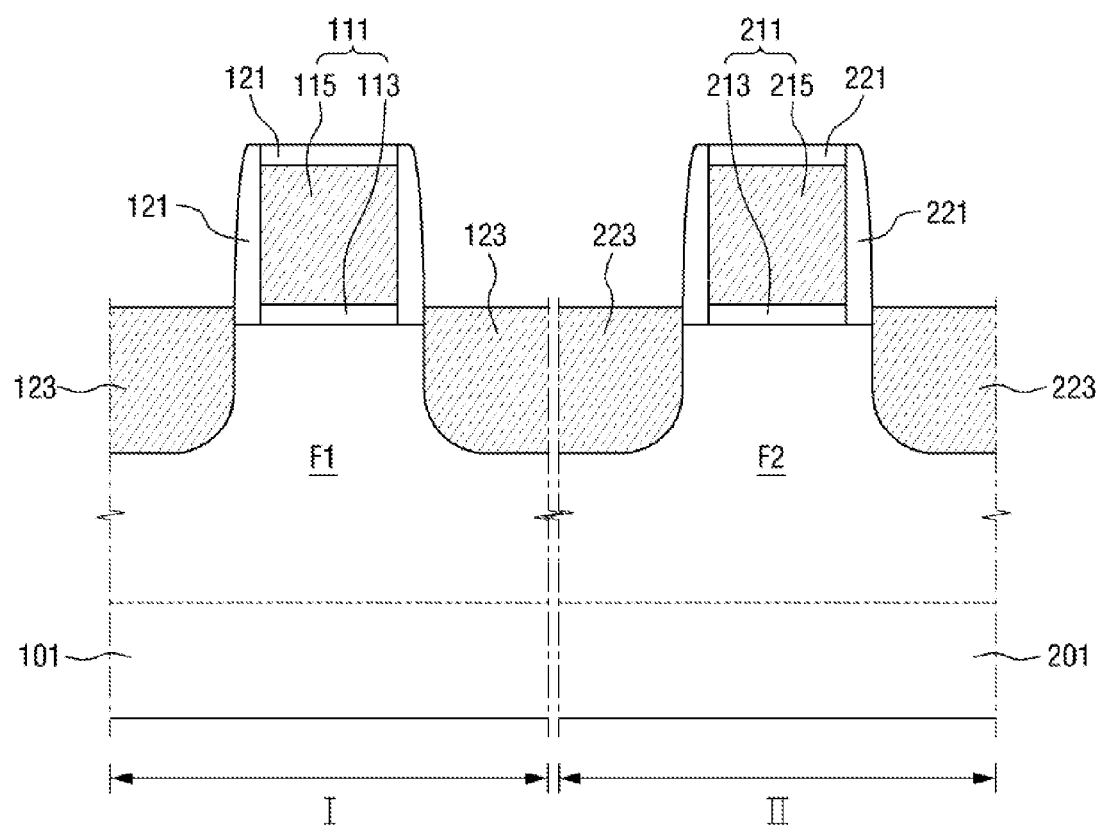

Referring to FIG. 18, upper portions of the field insulating layers 110 and 210 are recessed to expose upper portions of the first and second fins F1 and F2. A recess process may include, for example, a selective etching process.

On the other hand, parts of the first and second fins F1 and F2 projecting over the field insulating layers 110 and 210 may be formed through an epitaxial process. For example, after the field insulating layers 110 and 210 are formed, the parts of the first and second fins F1 and F2 may be formed through the epitaxial process, in which upper surfaces of the first and second fins F1 and F2 that are exposed by the field insulating layers 110 and 210 serve as seeds, without any recess process.

Further, doping for threshold voltage adjustment may be performed with respect to the exposed first and second fins F1 and F2. For example, the first fin F1 in the first region I may be doped using boron (B) as an impurity, and the second fin F2 in the second region II may be doped using phosphorous (P) or arsenide (As) as an impurity.

Then, first and second dummy gate structures 111 and 211, which cross the first and second fins F1 and F2, are respectively formed on the first and second fins F1 and F2. FIG. 18 illustrates that the first and second dummy gate structures 111 and 211 cross the first and second fins F1 and F2 at right angles, i.e., in the first direction X1, but the present inventive concept is not limited thereto. The first and second dummy structures 111 and 211 may respectively cross the first and second fins F1 and F2 to form an acute angle and/or an obtuse angle with the first direction X1.

The first and second dummy gate structures 111 and 211 may include dummy gate insulating layers 113 and 213 and dummy gate electrodes 115 and 215, respectively. The dummy gate insulating layers 113 and 213 and the dummy gate electrodes 115 and 215 may be successively stacked.

The dummy gate insulating layers 113 and 213 may not be covered by the field insulating layers 110 and 210, but may be conformally formed on upper portions of side walls and upper surfaces of the exposed first and second fins F1 and F2. Further, the dummy gate insulating layers 113 and 213 may be arranged between the dummy gate electrodes 115 and 215 and the field insulating layers 110 and 210.

The dummy gate electrodes 115 and 215 may be formed on the dummy gate insulating layers 113 and 213.

For example, the dummy gate electrodes 115 and 215 may include silicon oxide, and the dummy gate insulating layers 113 and 213 may include polysilicon.

Dummy hard mask layers 117 and 217 may be respectively formed on the first and second dummy gate structures 111 and 211. The dummy hard mask layers 117 and 217 may include at least one of silicon oxide, silicon nitride, and silicon oxynitride.

Figure 20:
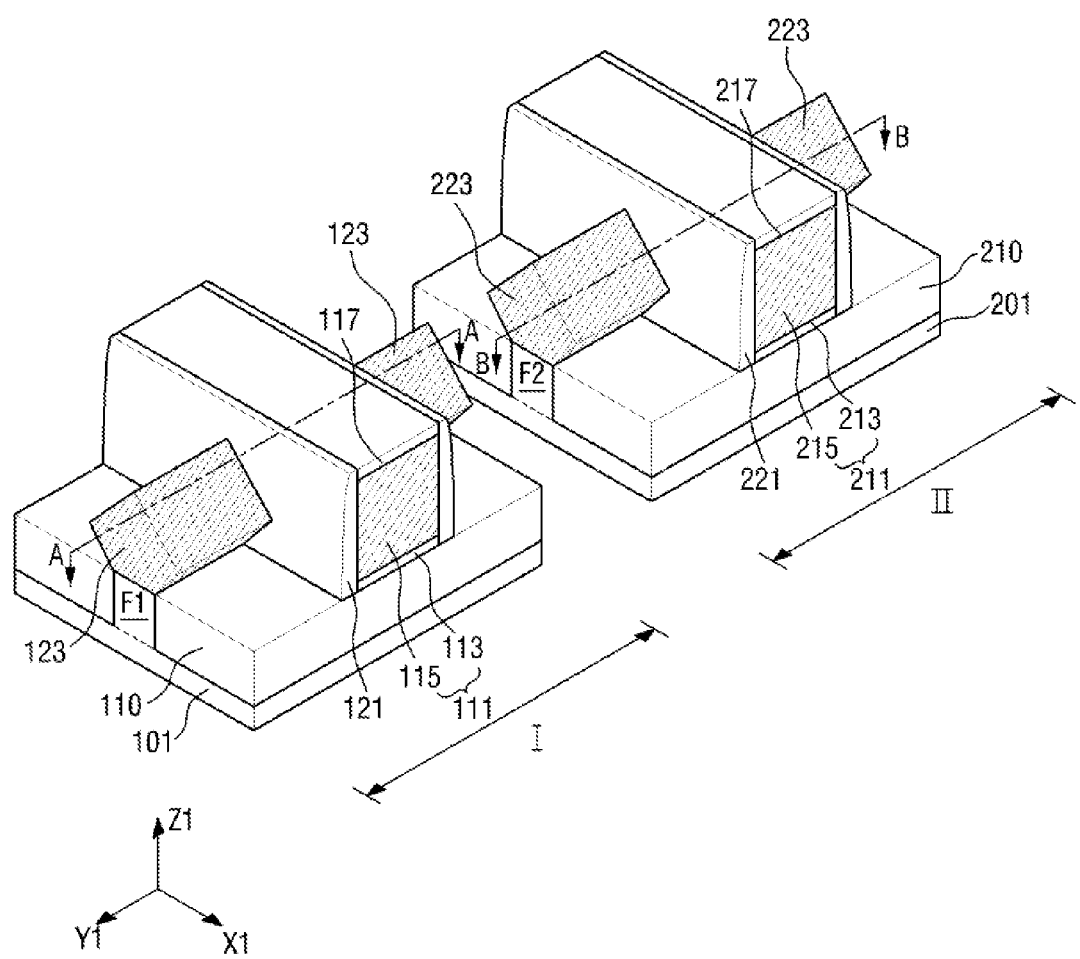

Referring to FIGS. 19 and 20, spacers 121 and 221 are formed on both side walls of the first and second dummy gate structures 111 and 211. The spacers 121 and 221 may expose upper surfaces of the hard mask layers 117 and 217. The spacers 121 and 221 may be made of silicon nitride or silicon oxynitride, for example.

Then, the exposed first and second fins F1 and F2 that are not covered by the first and second dummy gate structures 111 and 211 are etched. The first and second fins F1 and F2 may be etched using the spacers 121 and 221 and the first and second dummy gate structures 111 and 211 as etch masks.

Then, first and second source/drain regions 123 and 223 are formed on portions from which the first and second fins F1 and F2 are etched. The first source/drain regions 123 may be formed on the first fin F1, and the second source/drain regions 223 may be formed on the second fin F2. The first and second source/drain regions 123 and 223 may be elevated source/drain regions. Accordingly, as shown in FIG. 20, upper surfaces of the first and second source/drain regions 123 and 223 may be higher than upper surfaces of the first and second fins F1 and F2.

The first source/drain regions 123 of the first region I may include a tensile stress material. The first source/drain regions 123 may be made of the same material as the substrate 101 or a tensile stress material. For example, if the substrate 101 is made of Si, the first source/drain regions 123 may be made of Si or a material having smaller lattice constant than Si (e.g., SiC or SiP).

The second source/drain regions 223 of the second region II may include a compression stress material. For example, the compression stress material may be a material having larger lattice constant than Si, for example, SiGe. The compression stress material may apply compression stress to the second fin F2, i.e., the channel region, on the lower portion of the second dummy gate structure 211 to improve mobility of carriers in the channel region.

The first and second source/drain regions 123 and 223 may be formed, for example, through an epitaxial growth.

FIG. 19 illustrates that the first and second source/drain regions 123 and 223 are in the form of a pentagon, but the present inventive concept is not limited thereto. For example, the first and second source/drain regions 123 and 223 may be in the form of a quadrangle, circle, or hexagon.

Figure 21:
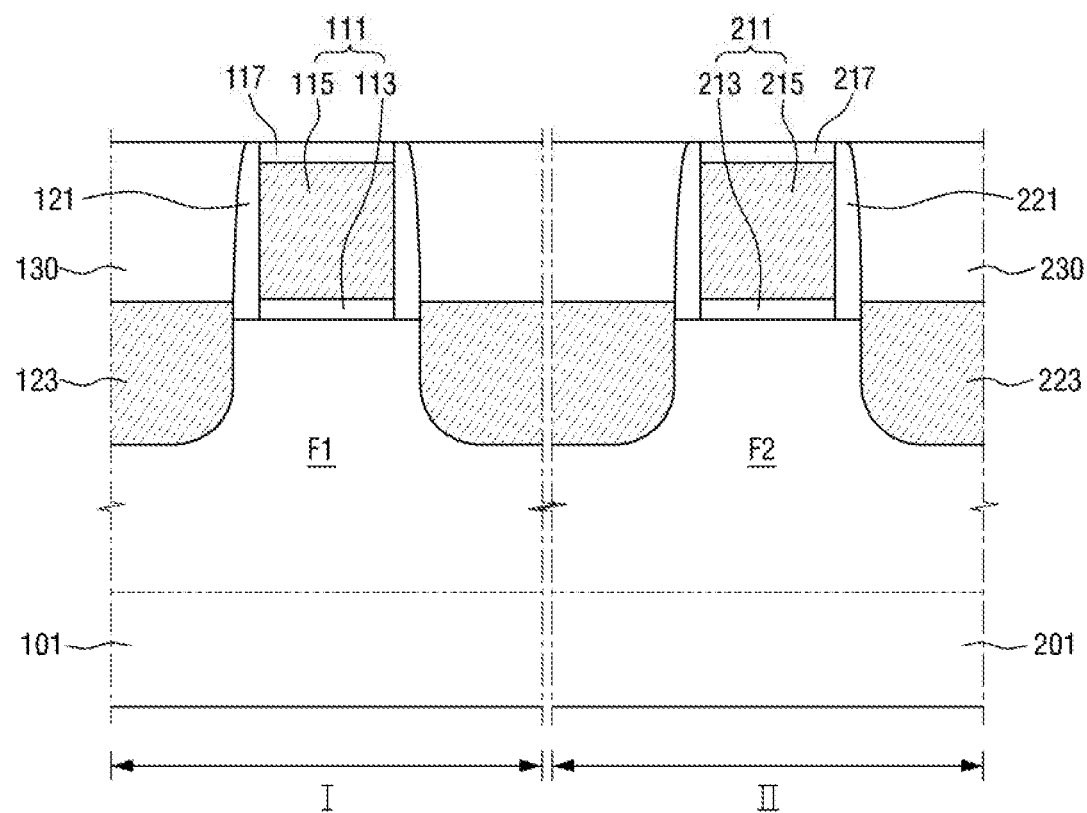

Referring to FIG. 21, first interlayer insulating layers 130 and 230 that cover the first and second source/drain regions 123 and 223 are formed. The first interlayer insulating layers 130 and 230 may cover the side walls of the spacers 121 and 221, and may expose the upper surfaces of the hard mask layers 117 and 217. The first interlayer insulating layers 130 and 230 may include, for example, silicon oxide.

Figure 22:
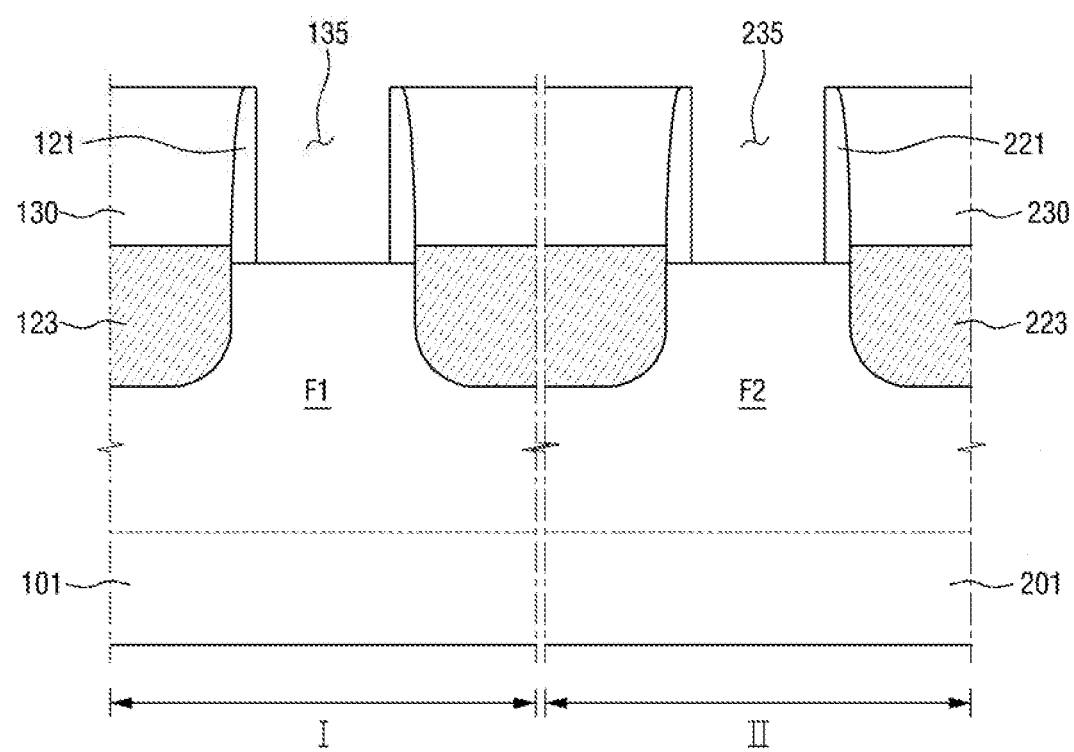

Referring to FIG. 22, first and second trenches 135 and 235 that expose the upper portions of the first and second fins F1 and F2 are formed. First, the hard mask layers 117 and 217 are removed. The hard mask layers 117 and 217 may be removed, for example, through a planarization process, and if the planarization process is performed, the first interlayer insulating layers 130 and 230 may also be partially etched.

Then, the first and second dummy gate structures 111 and 211 are removed. The first and second fins F1 and F2 are exposed through removal of the dummy gate electrodes 115 and 215 and the dummy gate insulating layers 113 and 213. The first trench 135 is formed on a place from which the first dummy gate structure 11 is removed, and the second trench 235 is formed on a place from which the second dummy gate structure 211 is removed. The side walls of the spacers 121 and 221 may be exposed by the first and second trenches 135 and 235.

Figure 23:
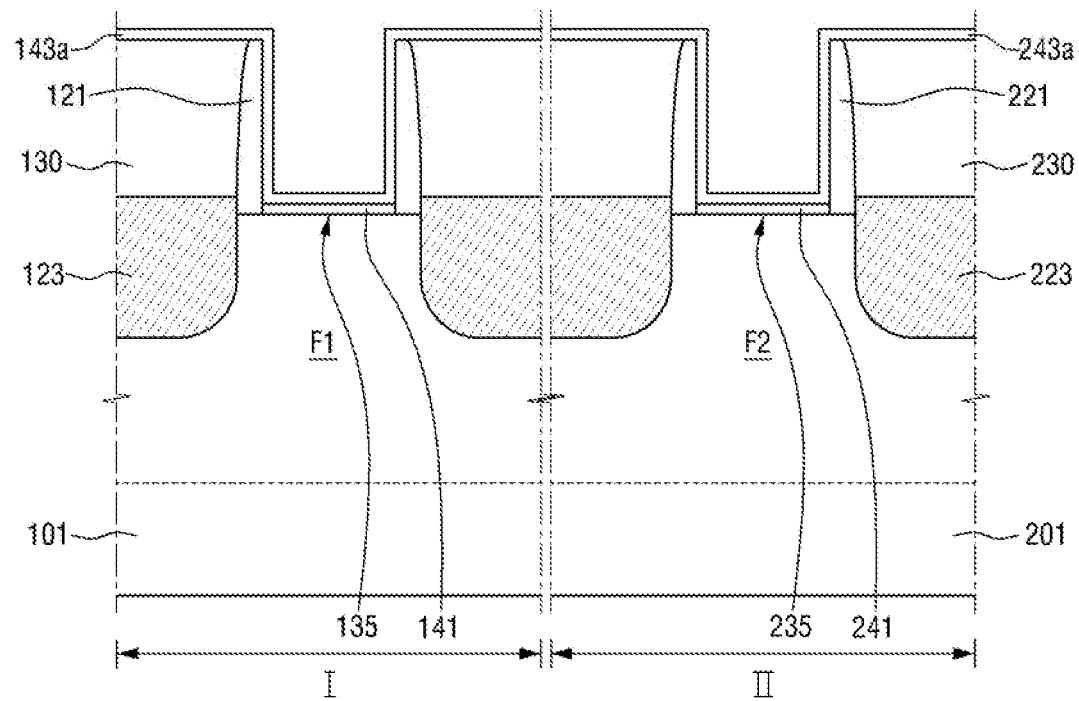

Referring to FIG. 23, first and second interface layers 141 and 241 are formed in the first and second trenches 135 and 235. The first and second interface layers 141 and 241 may be formed along upper surfaces and upper portions of the side walls of the first and second fins F1 and F2.

The first and second interface layers 141 and 241 may be formed through oxidization of the exposed first and second fins F1 and F2 in the first and second trenches 135 and 235, but are not limited thereto. The first and second interface layers 141 and 241 may be formed along bottom surfaces of the first and second trenches 135 and 235, respectively. The first and second interface layers 141 and 241 may serve to prevent inferior interfaces between the first and second fins F1 and F2 and first and second high-k layers 143a and 243a. The first and second interface layers 141 and 241 may include, for example, low-k material layers of which the dielectric constant is equal to or smaller than 9, for example, a silicon oxide layer (where, k is about 4) or a silicon oxynitride layer (where, k is about 4 to 8 depending on the oxygen atom content and the nitrogen atom content). Further, the first and second interface layers 141 and 241 may be made of silicate or may be a combination of the above-exemplified layers.

Then, the first high-k layer 143a is formed in the first trench 135, and the second high-k layer 243a is formed in the second trench 235. Specifically, the first high-k layer 143a may be conformally formed along the side walls and the lower surface of the first trench 135, and may be conformally formed along the upper portion of the side wall and the upper surface of the first fin F1 and the field insulating layer 110. The second high-k layer 243a may be conformally formed along the side wall and the bottom surface of the second trench 235, and may be conformally formed along the upper portion of the side wall and the upper surface of the second fin F2 and the field insulating layer 210. Further, the first and second high-k layers 143a and 243a may be formed even on the first interlayer insulating layers 130 and 230.

The first and second high-k layers 143a and 243a may include a high-k material having higher dielectric constant than a silicon oxide layer. For example, the first and second high-k layers 143a and 243a may include a material selected from the group including HFSiON, $HFO_2$, $ZrO_2$, $Ta_2O_5$, $TiO_2$, $SrTiO_3$, and $(Ba,Sr)TiO_3$. The first and second high-k layers 143a and 243a may be formed with an appropriate thickness according to the kind of a device to be formed.

Figure 24:
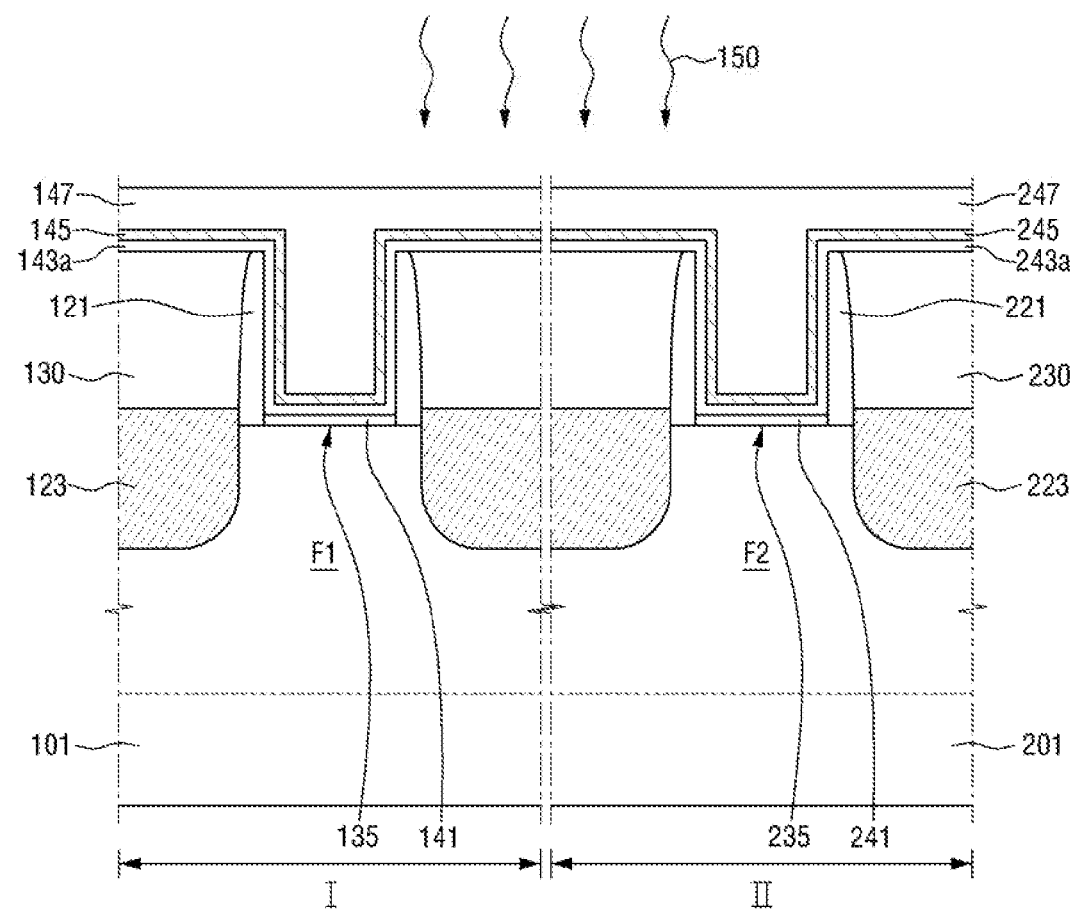

Referring to FIG. 24, first and second diffusion layers 145 and 245 and first and second blocking layers 147 and 247 are successively formed. The first diffusion layer 145 is formed in the first trench 135, and the second diffusion layer 245 is formed in the second trench 235. The first and second diffusion layers 145 and 245 may be conformally formed along the side walls and the bottom surfaces of the first and second trenches 145 and 245. Further, the first and second diffusion layers 145 and 245 may be formed along the upper portions of the side walls and the upper surfaces of the first and second fins F1 and F2. The first and second diffusion layers 145 and 245 may include, for example, TiN, but are not limited thereto.

Then, the first and second blocking layers 147 and 247 are formed on the first and second diffusion layers 145 and 245. The first and second blocking layers 147 and 247 may fill the first and second trenches 135 and 235, and may cover the first and second diffusion layers 145 and 245 to prevent the first and second diffusion layers 145 and 245 from being exposed to an outside. The first and second blocking layers 147 and 247 may include, for example, Si.

Then, annealing 150 is performed. The first and second high-k layers 143a and 243a include oxygen atoms. The oxygen atoms are bonded with other materials (e.g., Hf, Zr, Ta, and Ti) in the first and second high-k layers 143a and 243a, and such bonding may be partially in a broken state. If the bonding is broken, leakage current may occur to deteriorate the performance of a transistor. To prevent this problem, the annealing 150 is performed to bond the oxygen atoms in a portion where the bonding is broken. If the annealing 150 is performed, the oxygen atoms included in the first and second diffusion layers 145 and 245 are provided to the first and second high-k layers 143a and 243a.

On the other hand, if the first and second diffusion layers 145 and 245 are exposed during the annealing 150, external oxygen atoms penetrate into the first and second diffusion layers 145 and 245, and the number of oxygen atoms that move to lower portions of the first and second diffusion layers 145 and 245 is increased. If the number of oxygen atoms being supplied exceeds the number of oxygen atoms that are needed in the first and second high-k layers 143a and 243a, the excessive oxygen atoms may react on the first and second fins F1 and F2 in the first and second trenches 135 and 235. Accordingly, the first and second interface layers 141 and 241 may be thickened to deteriorate the performance of the transistor. In this case, the supply amount of oxygen atoms may be appropriately adjusted by blocking the first and second diffusion layers 145 and 245 from an outside through forming of the first and second blocking layers 147 and 247 on the first and second diffusion layers 145 and 245 during the annealing 150.

The annealing 150 may be performed at a temperature of about 500° C. to about 1500° C.

The thickness of the first and second diffusion layers 145 and 245 may differ depending on the number of oxygen atoms to be supplied.

Figure 25:
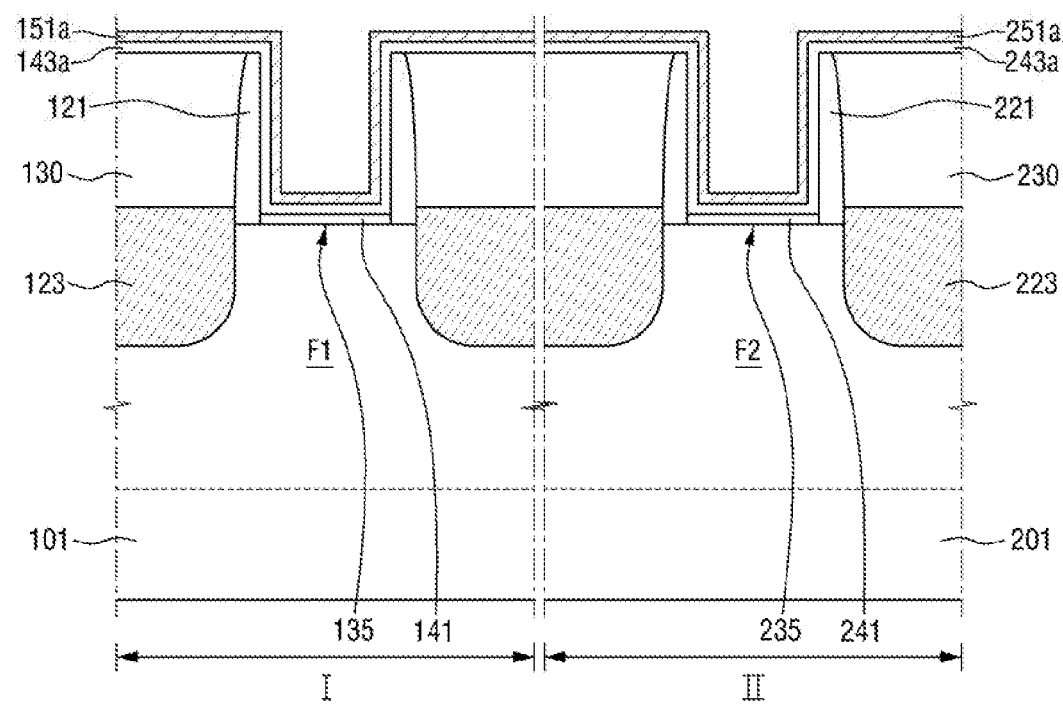

Referring to FIG. 25, the first and second blocking layers 147 and 247 and the first and second diffusion layers 145 and 245 are successively removed, and thus the first and second high-k layers 143a and 243a may be exposed again. Then, first and second barrier layers 151a and 251a are formed on the first and second high-k layers 143a and 243a. The first and second barrier layers 151a and 251a may be conformally formed along the side walls and the bottom surfaces of the first and second trenches 135 and 235. The first and second barrier layers 151a and 251a may be conformally formed along the upper portions of the side walls and the upper surfaces of the first and second fins F1 and F2. The first and second barrier layers 151a and 251a may have a thickness, for example, of about 3 Å to about 30 Å. Further, the first and second barrier layers 151a and 251a may include, for example, at least one of TaN, TaNO, TaSiN, and TiSiN, and may include a material that is different from the material included in the first and second diffusion layers 145 and 245.

Figure 26:
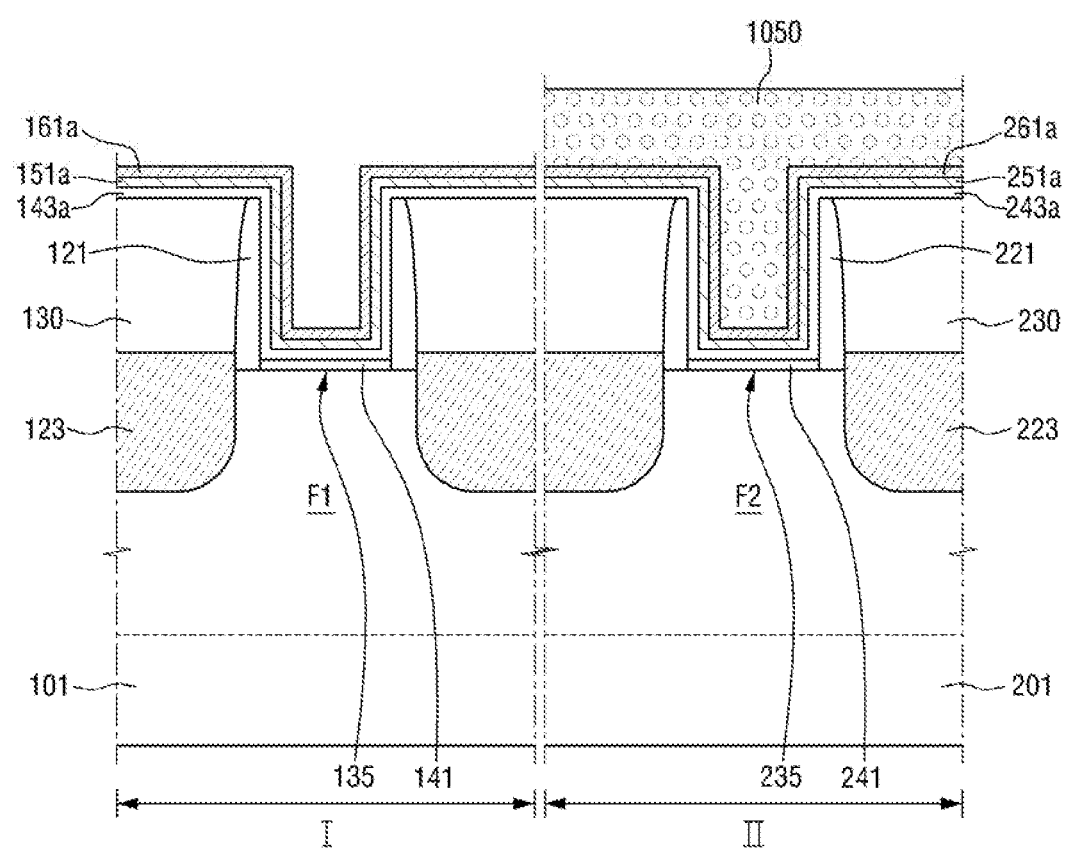

Referring to FIG. 26, first work function adjustment layers 161a and 261a are formed on the first and second barrier layers 151a and 251a. The first work function adjustment layers 161a and 261a may be formed along the side walls and the bottom surfaces of the first and second trenches 135 and 235. The first work function adjustment layers 161a and 261a may be conformally formed along the upper portions of the side walls and the upper surfaces of the first and second fins F1 and F2. The first work function adjustment layers 161a and 261a may be, for example, P-type work function adjustment layers, and may include, for example, TiN.

Then, a mask 1050 is formed on the first work function adjustment layer 261a in the second region II. The mask 1050 covers the second trench 235, and is not formed on the first region I.

Then, the first work function adjustment layer 161a in the first region I is removed using the mask 1050. The first barrier layer 151a in the first region I may not be removed, and may protect the first high-k layer 143a when the first work function adjustment layer 161a is removed. After the first work function adjustment layer 161a in the first region I is removed, the mask 1050 in the second region II is removed.

Figure 27:
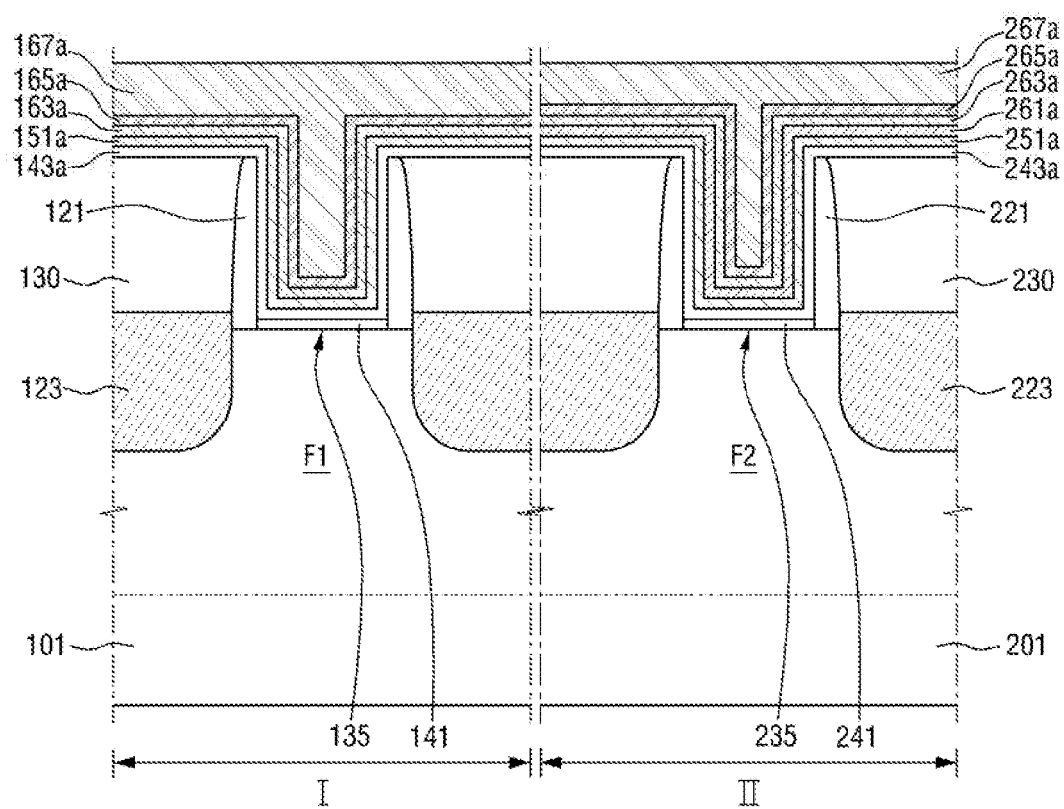

Referring to FIG. 27, second work function adjustment layers 163a and 263a are formed in the first region I and the second region II. The second work function adjustment layers 163a and 263a may be conformally formed along the side walls and the bottom surfaces of the first and second trenches 135 and 235. The second work function adjustment layers 163a and 263a may be formed along the upper portions of the side walls and the upper surfaces of the first and second fins F1 and F2. The second work function adjustment layers may be formed on the first barrier layer 151a in the first trench 135, and may be formed on the first work function adjustment layer 261a in the second trench 235. The second work function adjustment layers 163a and 263a may be, for example, P-type work function adjustment layers. The second work function adjustment layers 163a and 263a may include, for example, at least one of TiAl, TiAlC, TiAlN, TaC, TiC, and HfSi.

In the second region II, the second work function adjustment layer 263a may be stacked on the first work function adjustment layer 261a to arrange two work function adjustment layers. The first work function adjustment layer 261a that is arranged on the lower portion serves to adjust the operation characteristics of the transistor through adjustment of the work function of the transistor. Accordingly, the transistor formed in the second region II may operate as a P-type transistor. The transistor in the first region I may operate as an N-type transistor through the second work function adjustment layer 163a.

Then, third and fourth barrier layers 165a and 265a are formed on the second work function adjustment layers 163a and 263a. Specifically, the third barrier layer 165a may be conformally formed along the side walls and the bottom surface of the first trench 135, and the fourth barrier layer 265a may be conformally formed along the side walls and the bottom surface of the second trench 235. The third and fourth barrier layers 165a and 265a may be formed along the upper portions of the side walls and the upper surfaces of the first and second fins F1 and F2. The third and fourth barrier layers 165a and 265a may include, for example, TiN. The third and fourth barrier layers 165a and 265a may prevent a material that is included in first and second gate metals 167a and 267a from being diffused in the first and second trenches 135 and 235.

The first and second gate metals 167a and 267a are formed on the third and fourth barrier layers 165a and 254a. The first and second gate metals 167a and 267a may fill the remaining portions of the first and second trenches 135 and 235. The first and second gate metals 167a and 267a may include, for example, Al or W.

Figure 28:
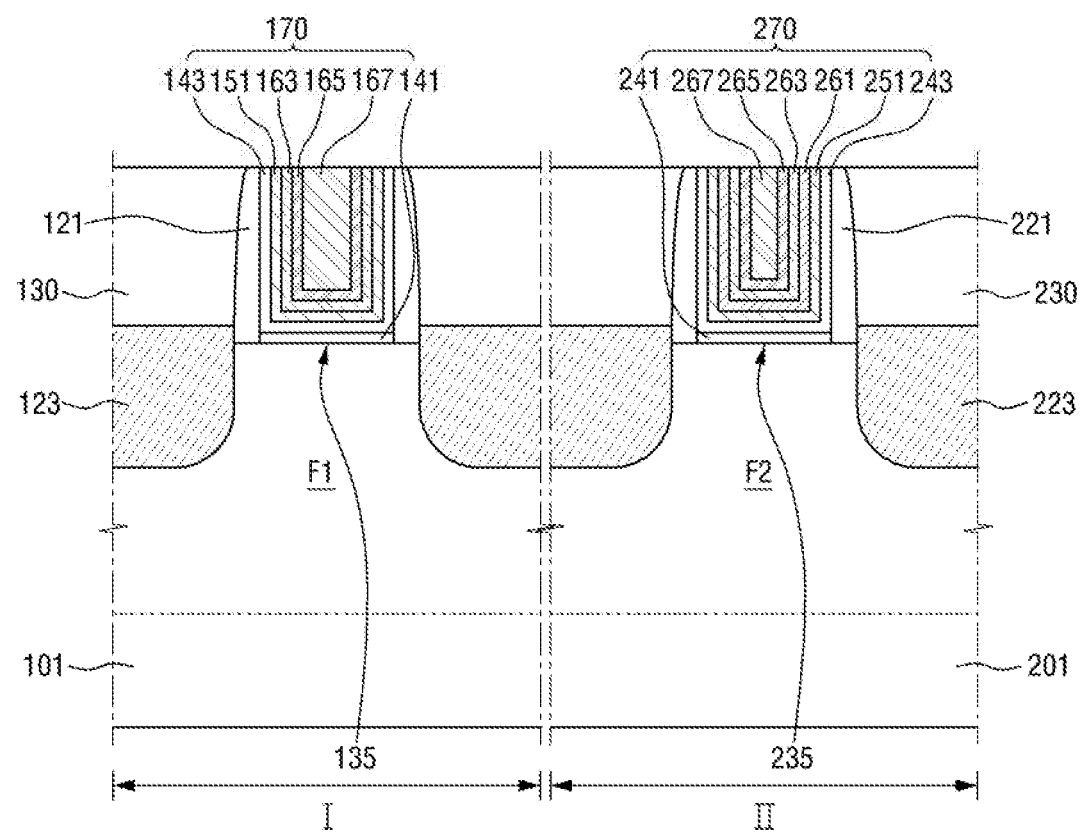

Referring to FIG. 28, first and second gate structures 170 and 270 are formed. If a planarization process is performed to expose the first interlayer insulating layers 130 and 230 in the resultant material of FIG. 27, the first gate structure 170, which includes the first interface layer 141, the first high-k layer 143, the first barrier layer 151, the second work function adjustment layer 163, the third barrier layer 135, and the first gate metal 167, may be formed in the first region I, and the second gate structure 270, which includes the second interface layer 241, the second high-k layer 243, the second barrier layer 251, the first and second work function adjustment layers 261 and 262, the fourth barrier layer 265, and the second gate metal 267, may be formed in the second region II. The first and second high-k layers 143 and 243, the first and second barrier layers 151 and 251, the first work function adjustment layer 261, and the second work function adjustment layers 163 and 263 may be in a concave shape in the first and second trenches 135 and 235.

Figure 29:
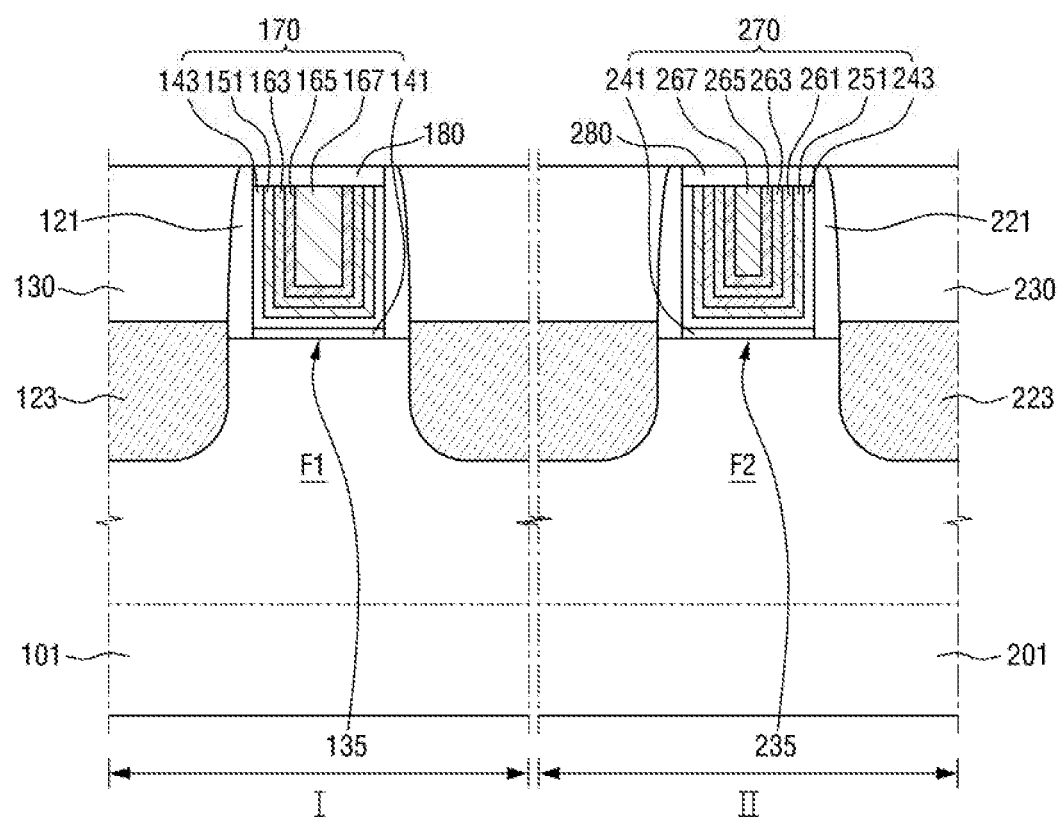

Referring to FIG. 29, first and second capping layers 180 and 280 may be formed on the first and second gate metals 170 and 270, respectively. Specifically, the first and second capping layers 180 and 280 are formed on the first and second gate metals 167 and 267 and may cover the first and second trenches 135 and 235, respectively. The first and second capping layers 180 and 280 may include, for example, nitride (e.g., at least one of SiN, SiON, and SiCON) or oxide. The first and second capping layers 180 and 280 may block the first and second gate structures 170 and 270 from an outside to prevent the performance change of the first and second gate structures 170 and 270. Typically, oxygen atoms may penetrate into the first and second gate structures 170 and 270, and in this case, the threshold voltages of the first and second gate structures 170 and 270 may be changed. Accordingly, the first and second capping layers 180 and 280 may be formed to keep the threshold voltages of the first and second gate structures 170 and 270 constant. The thickness of the first and second capping layers 180 and 280 may be, for example, about 5 Å to about 500 Å.

Before the first and second capping layers 180 and 280 are formed, parts of the first and second gate structures 170 and 270 may be removed to adjust the height of the first and second gate structures 170 and 270. Accordingly, the first and second high-k layers 143 and 243, the first and second barrier layers 151 and 251, the first work function adjustment layer 261, the second work function adjustment layers 163 and 263, the third and fourth barrier layers 165 and 265, and the first and second gate metals 167 and 267 in the first and second trenches 135 and 235 may be partially removed. In this case, side walls of the first and second capping layers 180 and 280 may come in contact with the side walls of the spacers 121 and 221. Further, upper surfaces of the first and second capping layers 180 and 280 may be arranged on the same plane as the first interlayer insulating layers 130 and 230.

The threshold voltages of the first and second gate structures 170 and 270 may be adjusted through adjustment of the height of the first and second gate structures 170 and 270.

Figure 30:
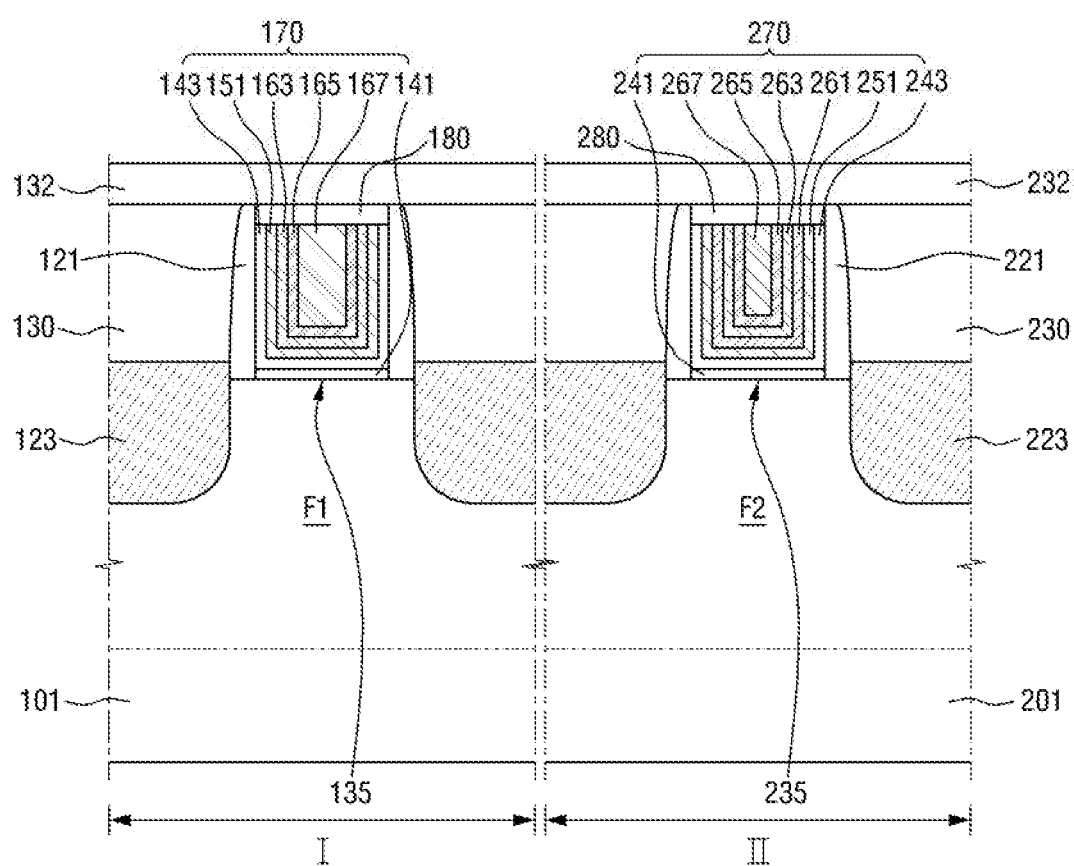

Referring to FIG. 30, second interlayer insulating layers 132 and 232 are formed on the first interlayer insulating layers 130 and 230. The second interlayer insulating layers 132 and 232 may cover the first and second capping layers 180 and 280. The second interlayer insulating layers 132 and 232 may include the same material as the first interlayer insulating layers 130 and 230, and may include, for example, silicon oxide.

Referring to FIGS. 31 to 33, first and second silicide layers 191 and 291 are respectively formed on the first and second source/drain regions 123 and 223, and first and second contacts 193 and 293 that penetrate the first interlayer insulating layers 130 and 230 and the second interlayer insulating layers 132 and 232 are formed on the first and second source/drain regions 123 and 223 to form the semiconductor device 6. The first and second silicide layers 191 and 291 may serve to decrease surface resistance and contact resistance of the first and second source/drain regions 123 and 223, and may include, for example, Pt, Ni, or Co. The first and second contacts 193 and 293 may include, for example, W, Al, or Cu.

Referring to FIGS. 16 to 26, and 34 to 36, a method for fabricating a semiconductor device 7 according to still another embodiment of the present inventive concept will be described. Explanation of the duplicate contents as described above will be omitted, and the explanation will be made around the different point between this embodiment and the above-described embodiment.

Figure 34:
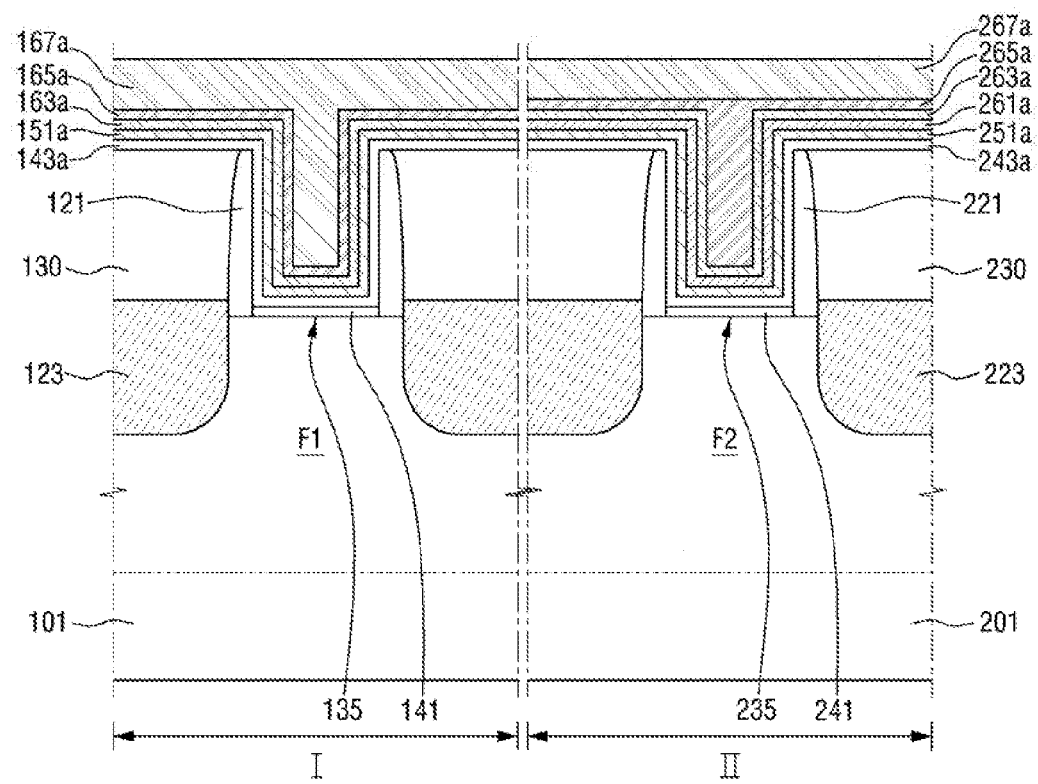
FIGS. 34 to 36 are views of intermediate steps explaining a method for fabricating a semiconductor device 7 according to still another embodiment of the present inventive concept.
Figure 35:
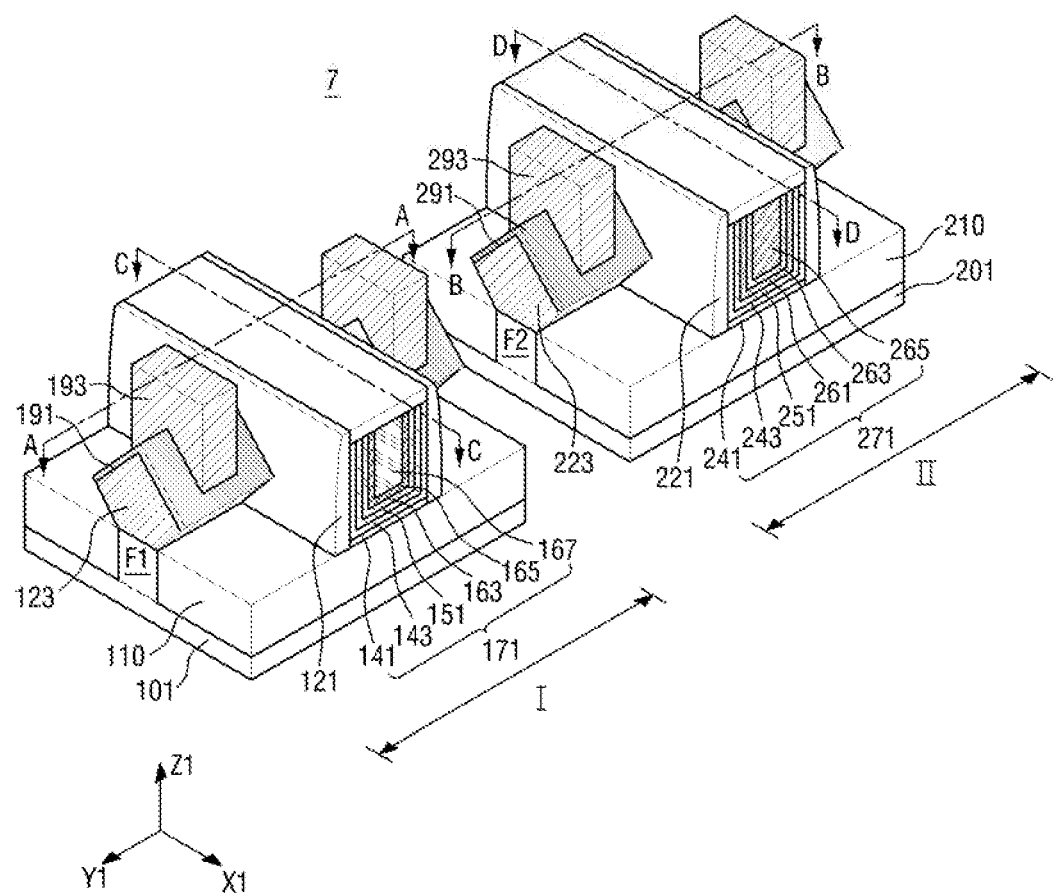
Figure 36:
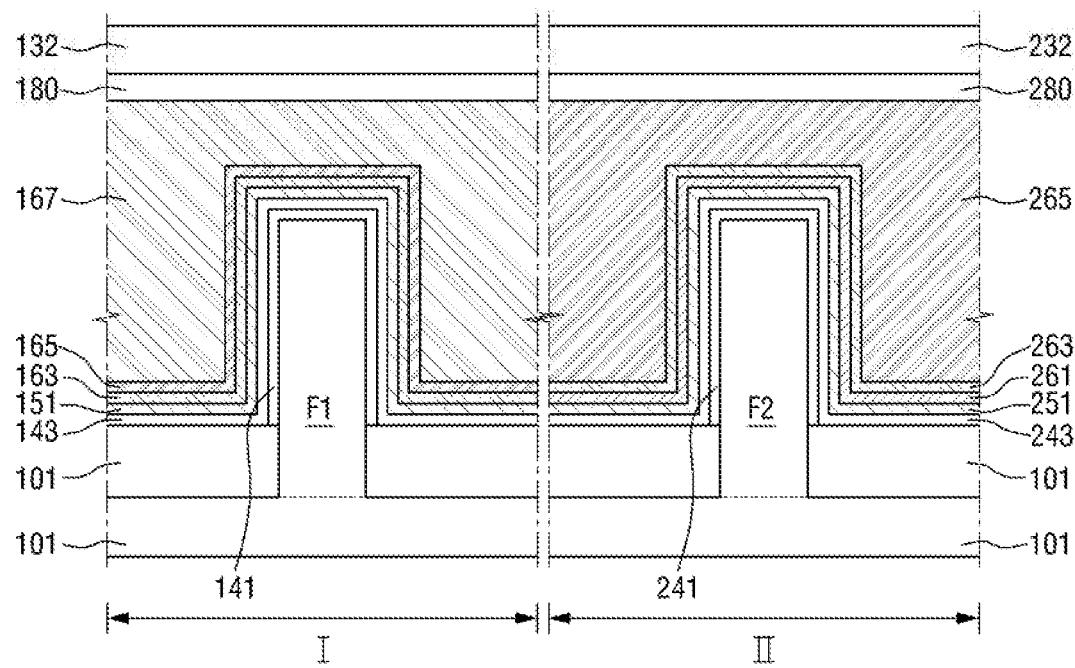

FIGS. 34 to 36 are views of intermediate steps explaining a method for fabricating a semiconductor device 7 according to still another embodiment of the present inventive concept. Specifically, FIG. 35 is a perspective view, FIG. 34 is a cross-sectional view taken along lines A-A and B-B of FIG. 19, and FIG. 36 is a cross-sectional view taken along lines C-C and D-D of FIG. 35. In FIG. 34, illustration of first interlayer insulating layers 130 and 230 and second interlayer insulating layers 132 and 232 is omitted.

Since the fabricating method in FIGS. 16 to 28 is the same as that as described above, the duplicate explanation thereof will be omitted.

Then, referring to FIG. 34, after the mask pattern 1050 is removed, the second work function adjustment layers 163a and 263a, the third and fourth barrier layers 165a and 265a, and the first and second gate metals 167a and 267a are successively formed. In this case, unlike FIG. 27, the second gate metal 267a is unable to fill the second trench 235. This is because the width between the spacers 221 of the second region II is narrow, and unlike the first region I, the first work function adjustment layer 261a is formed in the second trench 235 of the second region II. Accordingly, the fourth barrier layer 265a that is formed on the second work function adjustment layer 263a fills the second trench 235, and the second gate metal 267a is formed on the fourth barrier layer 265a.

Then, through the fabricating process as illustrated in FIGS. 28 to 30, the first and second silicide layers 191 and 291 and the first and second contacts 193 and 293 are formed so as to form the semiconductor device 7 of FIGS. 35 and 36. A third gate structure 171 may be formed in the first region I, and a fourth gate structure 271 may be formed in the second region II. The third gate structure 171 may be the same as the first gate structure 170 of FIG. 31, and the fourth gate structure 271 may not include the second gate metal 267 unlike the first gate structure 170 of FIG. 31.

Since the first work function adjustment layer 161 is not formed on the third gate structure 171 and the second gate metal 267 is not formed on the fourth gate structure 271, the number of layers included in the third gate structure 171 may be equal to the number of layers included in the fourth gate structure 271. FIG. 35 illustrates that each of the third and fourth gate structures 171 and 271 includes 6 layers, but the embodiments are not limited thereto. The number of layers included in the third or fourth gate structure 171 or 271 may be larger or smaller than 6.

Referring to FIGS. 16 to 30, and 37, a method for fabricating a semiconductor device 8 according to still another embodiment of the present inventive concept will be described. Explanation of the duplicate contents as described above will be omitted, and the explanation will be made around the different point between this embodiment and the above-described embodiment.

Figure 37:
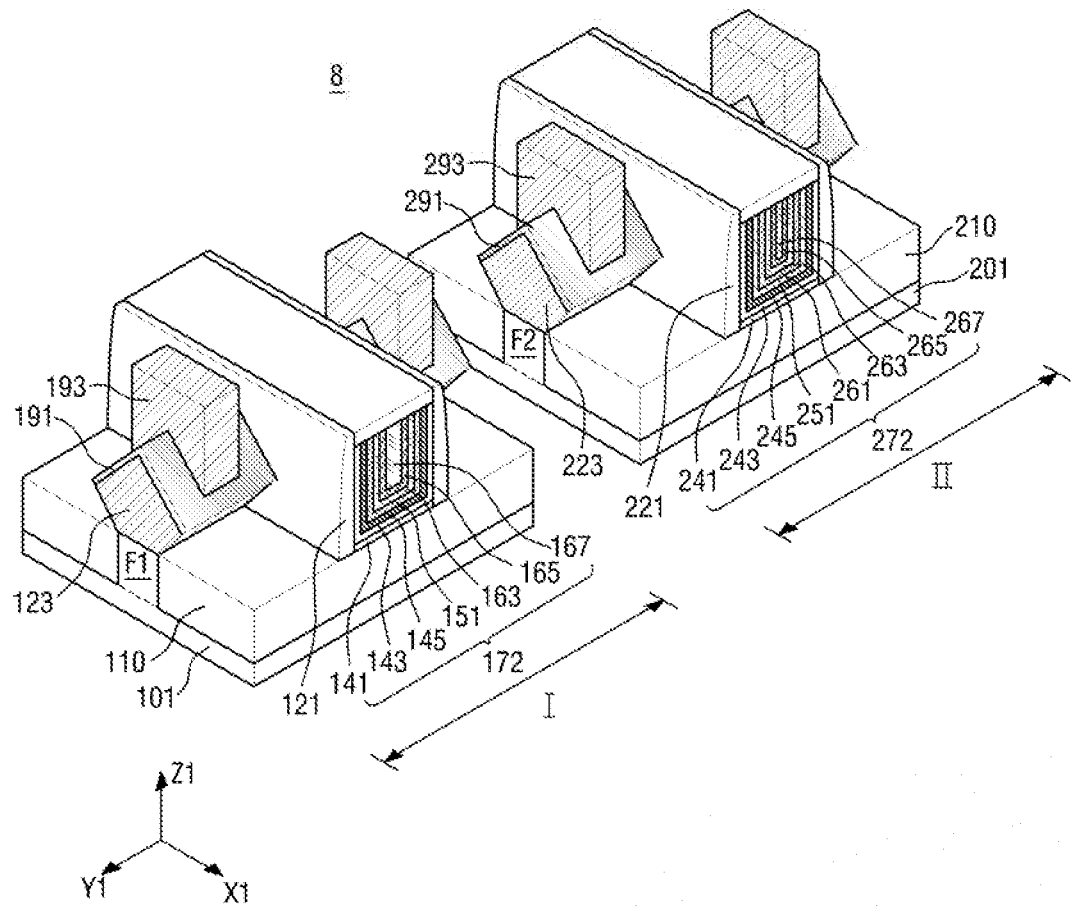
FIG. 37 is a perspective view explaining a method for fabricating a semiconductor device 8 according to still another embodiment of the present inventive concept.

FIG. 37 is a perspective view explaining a method for fabricating a semiconductor device 8 according to still another embodiment of the present inventive concept.

Since the fabricating method in FIGS. 16 to 24 is the same as that as described above, the explanation thereof will be omitted.

In the method for fabricating a semiconductor device 1 of FIG. 31, the first and second blocking layers 147 and 247 and the first and second diffusion layers 145 and 245 are all removed as shown in FIG. 25. However, in this embodiment, only the first and second blocking layers 147 and 247 are removed, and the first and second diffusion layers 145 and 245 are not removed.

The fabricating process illustrated in FIGS. 26 to 30 is performed in a state where the first and second diffusion layers 145 and 245 remain in the first and second trenches 135 and 235, and the first and second silicide layers 191 and 291 and the first and second contacts 193 and 293 are formed so as to form the semiconductor device 8 of FIG. 37.

The fifth and sixth gate structures 172 and 272 further include the first and second diffusion layers 145 and 245, respectively, in comparison to the first and second gate structures 170 and 270 of FIG. 31. The first diffusion layer 145 may be arranged between the first high-k layer 143 and the first barrier layer 151, and the second diffusion layer 245 may be arranged between the second high-k layer 243 and the second barrier layer 251.

Figure 38:
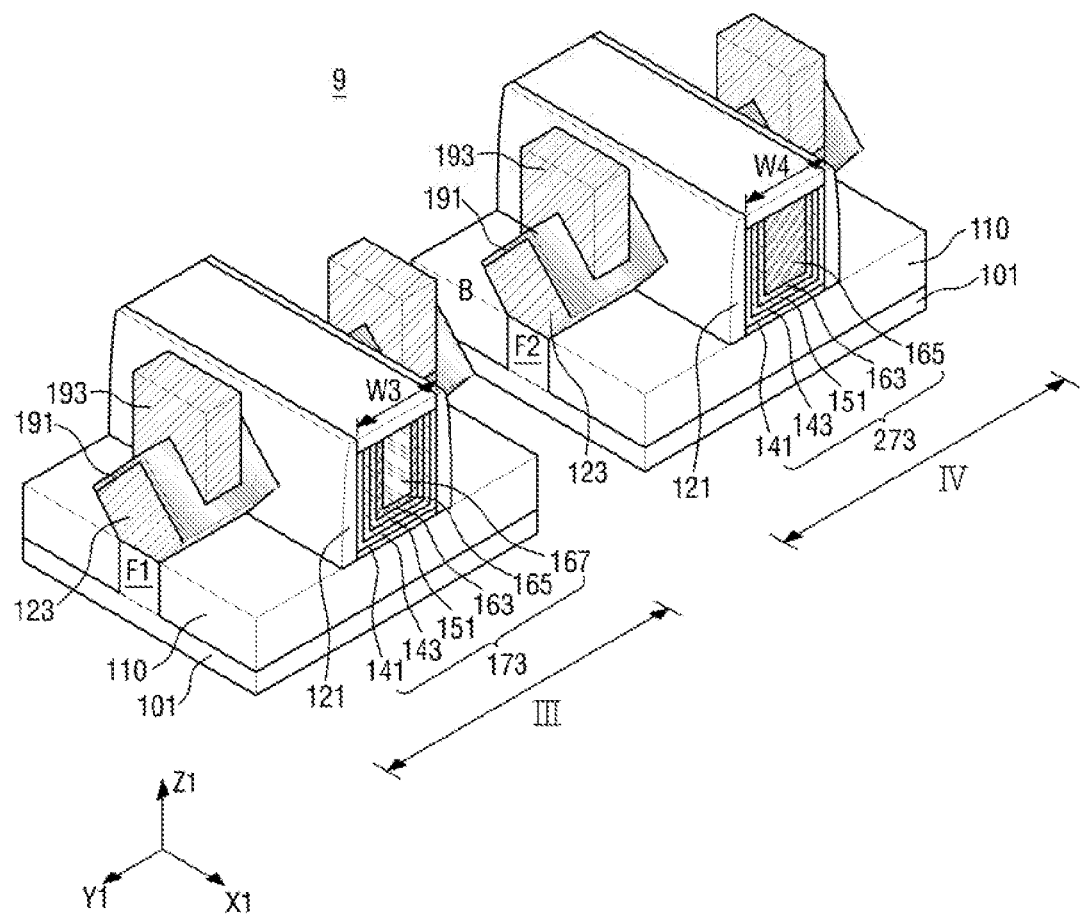
FIG. 38 is a cross-sectional view explaining a method for fabricating a semiconductor device 9 according to still another embodiment of the present inventive concept.

Referring to FIG. 38, a method for fabricating a semiconductor device 9 according to still another embodiment of the present inventive concept will be described. Explanation of the duplicate contents as described above will be omitted, and the explanation will be made around the different point between this embodiment and the above-described embodiment.

FIG. 38 is a perspective view explaining a method for fabricating a semiconductor device 9 according to still another embodiment of the present inventive concept.

In the semiconductor device 9, the substrate 101 may include a third region III and a fourth region IV. The third region III and the fourth region IV may be connected to each other, or may be apart from each other. Here, the fourth region IV may be a region where a transistor that has a low threshold voltage and a high switching speed is formed, and the third region III may be a region where a transistor that has a high threshold voltage, a low switching speed, and high reliability is formed. For example, the fourth region IV may be a cell array region where a cell array, in which unit memory cells are gathered in the form of a matrix, is formed, and the third region III may be a core/peripheral region where peripheral circuits, which carry external data into the cell array or carry data of the cell array to an outside, are complicatedly formed. However, the present inventive concept is not limited thereto.

Further, for example, the fourth region IV may be an SRAM region, and the third region III may be a logic region, but are not limited thereto. The fourth region IV may be a logic region, and the third region III may be a region where other memories are formed (e.g., a DRAM, an MRAM, a RRAM, and a PRAM).

A seventh gate structure 173 of the third region III may be formed in the same manner as the first region of FIGS. 16 to 33. Like the third region III, an eighth gate structure 273 of the fourth region IV may be formed in the same manner as the first region I of FIGS. 16 to 25. However, since the width W4 of the eighth gate structure 273 of the fourth region IV is narrower than the width W3 of the seventh gate structure 173 of the third region III, the first gate metal 167 may not be included therein. Specifically, referring to the first region I of FIG. 25, the second work function adjustment layer 163a, the third barrier layer 165a, and the first gate metal 167a may be successively stacked on a first terminal effect improvement layer 151a, and the first gate metal 167a may fill the first trench 135. However, since the width W4 of the first trench 135 is narrow in the fourth region IV, the second work function adjustment layer 163a, the third barrier layer 165a, and the first gate metal 167a may be successively stacked on the first terminal effect improvement layer 151a in the same manner, but the third barrier layer 165a may fill the first trench 135.

Then, through the fabricating process as illustrated in FIGS. 26 to 30, the first silicide layer 191 and the first contact 193 are formed so as to form the semiconductor device 9 of FIG. 38.

The seventh gate structure 173 of the third region includes the first interface layer 141, the first high-k layer 143, the first barrier layer 151, the second work function adjustment layer 163, the third barrier layer 165, and the first gate metal 167, and the eighth gate structure 273 of the fourth region IV includes the first interface layer 141, the first high-k layer 143, the first barrier layer 151, the second work function adjustment layer 163, and the third barrier layer 165. As a result, the number of layers included in the seventh gate structure 173 of the third region III may be larger than the number of layers included in the eighth gate structure 273 of the fourth region IV.

FIG. 38 illustrates that an N-type transistor is formed in both the third region III and the fourth region IV, but is not limited thereto. A P-type transistor may be formed in the third region III and the fourth region IV. In this case, the third region III may have the same shape as the second region II of FIG. 31, and the fourth region IV may have the same shape as the second region II of FIG. 35.

Figure 39:
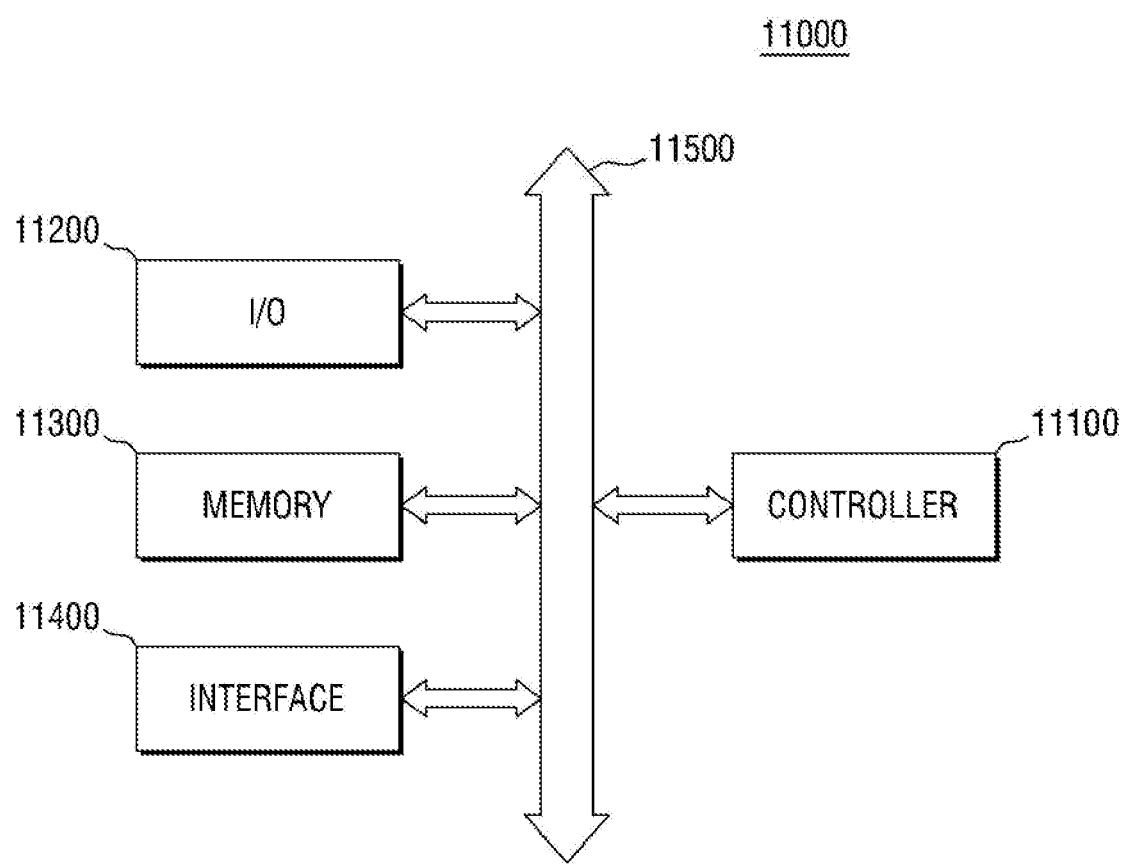
FIG. 39 is a block diagram of an electronic system including one of the semiconductor devices 1 to 9 fabricated according to some embodiments of the present inventive concept.

FIG. 39 is a block diagram of an electronic system including one of the semiconductor devices 1 to 9 fabricated according to some embodiments of the present inventive concept.

Referring to FIG. 39, an electronic system 11000 according to certain embodiments of the present inventive concept may include an electronic device that includes a controller 11100, an input/output (I/O) device 11200, a memory 11300, an interface 11400, and a bus 11500. The controller 11100, the I/O device 11200, the memory 11300, and/or the interface 11400 may be coupled to one another through the bus 11500. The bus 11500 corresponds to paths through which data is transferred.

The controller 11100 may include at least one of a microprocessor, a digital signal processor, a microcontroller, and logic elements that can perform similar functions. The I/O device 11200 may include a keypad, a keyboard, and a display device. The memory 11300 may store data and/or commands. The interface 11400 may function to transfer the data to a communication network or receive the data from the communication network. The interface 11400 may be of a wired or wireless type. For example, the interface 11400 may include an antenna or a wire/wireless transceiver. Although not illustrated, the electronic system 11000 may further include a high-speed DRAM and/or SRAM as an operating memory for improving the operation of the controller 11100. The semiconductor device according to the embodiments of the present inventive concept may be provided inside the memory 11300 or may be provided as a part of the controller 11100 or the I/O device 11200.

The electronic system 11000 may be applied, for example, to a PDA (Personal Digital Assistant), a portable computer, a web tablet, a wireless phone, a mobile phone, a digital music player, a memory card, or all electronic devices that can transmit and/or receive information in wireless environments.

Figure 40:
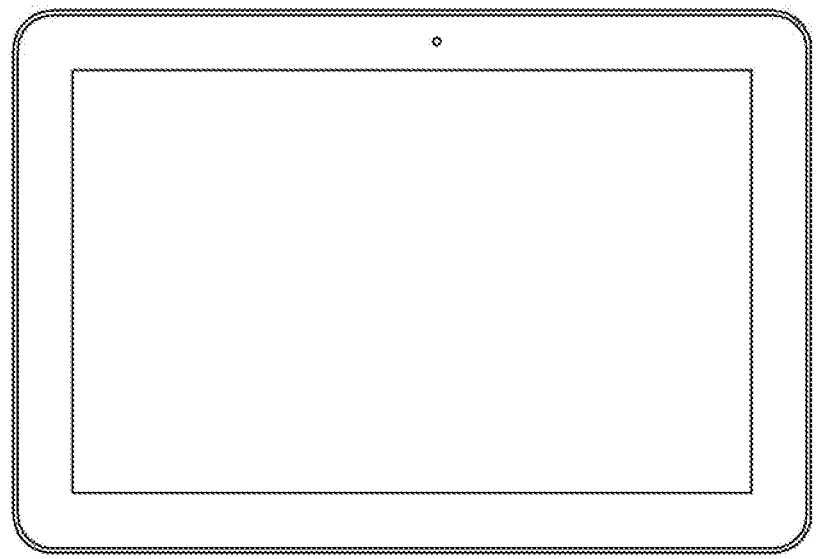
FIGS. 40 and 41 are exemplary views illustrating a semiconductor system to which a semiconductor device fabricated according to embodiments of the present inventive concept can be applied.
Figure 41:
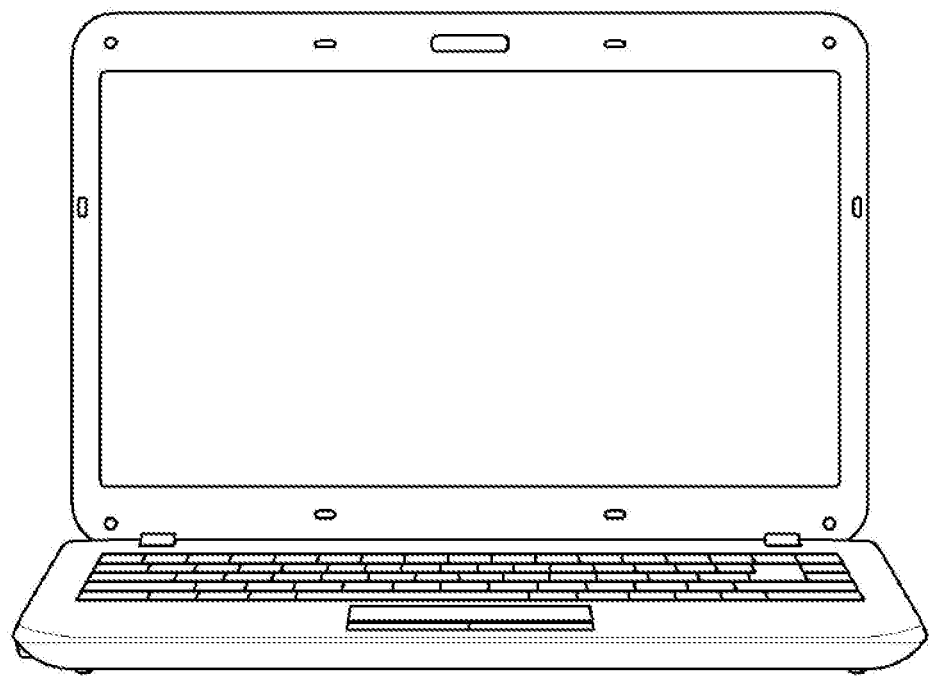

FIGS. 40 and 41 are exemplary views illustrating a semiconductor system to which a semiconductor device fabricated according to embodiments of the present inventive concept can be applied. FIG. 40 illustrates a tablet PC, and FIG. 41 illustrates a notebook PC. The semiconductor devices fabricated according to the embodiments of the present inventive concept may be used in the tablet PC or the notebook PC. It is apparent to those of skilled in the art that the semiconductor device fabricated according to some embodiments of the present inventive concept can be applied even to other integrated circuit devices or electronic devices that have not been exemplified.

Although various embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A semiconductor device comprising:
a substrate on which a first region and a second region are defined;
first and second gate structures arranged on the first and second regions, respectively; and
a capping layer covering the first and second gate structures,
wherein the first gate structure includes a first interface layer arranged on the substrate, a first high-k dielectric layer arranged on the first interface layer, a first diffusion layer arranged on the first high-k dielectric layer, a first barrier layer arranged on the first diffusion layer, a first work function adjustment layer arranged on the first barrier layer, a third barrier layer arranged on the first work function adjustment layer, and a gate metal arranged on the first work function adjustment layer, and
wherein the second gate structure includes a second interface layer arranged on the substrate, a second high-k dielectric layer arranged on the second interface layer, a second diffusion layer arranged on the second high-k dielectric layer, a second barrier layer arranged on the second diffusion layer, a second work function adjustment layer arranged on the second barrier layer, a third work function adjustment layer arranged on the second work function adjustment layer, and a fourth barrier layer arranged on the third work function adjustment layer.

2. The semiconductor device of claim 1, further comprising:
a first fin projecting from the first region and extending in a first direction; and
a second fin projecting from the second region and extending in the first direction,
wherein the first gate structure is arranged on the first fin to cross the first fin, and the second gate structure is arranged on the second fin to cross the second fin.

3. The semiconductor device of claim 1, wherein the first work function adjustment layer and the third work function adjustment layer include the same material.

4. The semiconductor device of claim 1, wherein the number of layers included in the first gate structure is different from the number of layers included in the second gate structure.

5. The semiconductor device of claim 1, wherein the capping layer includes at least one of SiN, SiON, and SiCON.

6. The semiconductor device of claim 1, wherein the first region includes an NFET region, and the second region includes a PFET region.

7. The semiconductor device of claim 1, wherein a thickness of the first barrier layer is 3 to 30 Å.

8. The semiconductor device of claim 1, wherein the diffusion layer and the first barrier layer comprise different materials.

9. The semiconductor device of claim 8, wherein the diffusion layer comprises Ti, and the first barrier layer comprises Ta.

10. The semiconductor device of claim 1, wherein a thickness of the capping layer is 5 to 500 Å.

11. The semiconductor device of claim 10, wherein the capping layer comprises an oxide layer.

12. The semiconductor device of claim 10, wherein the capping layer comprises a nitride layer.

* * * * *